(12) United States Patent
Zamarron

(10) Patent No.: US 11,564,316 B2
(45) Date of Patent: Jan. 24, 2023

(54) APPARATUS AND METHOD FOR IMPEDANCE BALANCING OF LONG RADIO FREQUENCY (RF) VIA

(71) Applicant: LOCKHEED MARTIN CORPORATION, Bethesda, MD (US)

(72) Inventor: Jesse Michael Zamarron, Dallas, TX (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 113 days.

(21) Appl. No.: 17/280,269

(22) PCT Filed: Nov. 21, 2019

(86) PCT No.: PCT/US2019/062570
§ 371 (c)(1),
(2) Date: Mar. 26, 2021

(87) PCT Pub. No.: WO2020/112481
PCT Pub. Date: Jun. 4, 2020

(65) Prior Publication Data
US 2022/0053640 A1 Feb. 17, 2022

Related U.S. Application Data

(60) Provisional application No. 62/772,824, filed on Nov. 29, 2018.

(51) Int. Cl.
*H05K 1/11* (2006.01)
*H05K 1/02* (2006.01)
*H05K 3/42* (2006.01)

(52) U.S. Cl.
CPC ........... *H05K 1/115* (2013.01); *H05K 1/0237* (2013.01); *H05K 1/111* (2013.01); *H05K 3/429* (2013.01); *H05K 2201/09609* (2013.01)

(58) Field of Classification Search
CPC .... H05K 1/0222; H05K 1/0228; H05K 1/025; H05K 1/0251; H05K 1/0253;
(Continued)

(56) References Cited

U.S. PATENT DOCUMENTS 6,525,695 B2   2/2003   McKinzie, III
6,753,218 B2   6/2004   Devoe et al.
(Continued)

FOREIGN PATENT DOCUMENTS

WO   2014105435   7/2014

*Primary Examiner* — Hoa C Nguyen
*Assistant Examiner* — John B Freal
(74) *Attorney, Agent, or Firm* — Terry M. Sanks, Esq.; Beusse Sanks, PLLC

(57) ABSTRACT

An apparatus comprising a stack of printed circuit board (PCB) layers having a primary longitudinal structure forming a radio frequency (RE) via including a principal tuning section (223) and a constant longitudinal structure (227) along a conductive column support (255) journaled through the layers in the via. The principal section (221) comprising a first tuning sub-assembly (229 A) in a first portion of the RE via above the longitudinal structure (227) and at an entrance of the primary longitudinal structure (221) and comprising a first set of pad, anti-pad pairs (445, 545, 645) tuned to receive an RE band. A second principal tuning sub-assembly (229B) in a second portion of the via below the longitudinal structure (227) and at an exit of the primary longitudinal structure and comprising a second set of pad, anti-pad pairs (445, 545, 645) tuned to receive the band and mirroring the first set of pairs.

20 Claims, 21 Drawing Sheets

(58) Field of Classification Search
CPC .......... H05K 1/115; H05K 1/116; H05K 1/14;
H05K 1/141; H05K 1/144; H05K
2201/09609; H05K 2201/09563; H05K
2201/09618; H05K 2201/09636; H05K
2201/09672; H05K 1/0216–0224; H05K
1/117

See application file for complete search history.

(56) References Cited

U.S. PATENT DOCUMENTS

| | | |
|---|---|---|
| 6,774,867 B2 | 8/2004 | Diaz et al. |
| 6,828,513 B2 | 12/2004 | Kistner |
| 6,845,492 B1 | 1/2005 | Frank et al. |
| 6,933,450 B2 | 8/2005 | Okumichi et al. |
| 6,976,233 B1 | 12/2005 | Frank et al. |
| 7,030,712 B2 | 4/2006 | Brunette et al. |
| 7,155,821 B1 * | 1/2007 | Downes ................ H05K 1/115 29/842 |
| 7,249,337 B2 * | 7/2007 | Gisin .................... G06F 30/367 361/600 |
| 7,339,260 B2 | 3/2008 | Sugimoto et al. |
| 7,372,143 B2 | 5/2008 | Nakamura et al. |
| 7,463,122 B2 | 12/2008 | Kushta et al. |
| 7,479,857 B2 | 1/2009 | McKinzie, III |
| 7,492,146 B2 | 2/2009 | Behziz |
| 7,705,695 B2 * | 4/2010 | Kushta ................ H05K 1/0222 333/204 |
| 7,781,889 B2 | 8/2010 | Leader et al. |
| 7,868,257 B2 | 1/2011 | Kushta et al. |
| 8,058,956 B2 | 11/2011 | Jow et al. |
| 8,198,954 B2 | 6/2012 | Makino et al. |
| 8,212,154 B2 | 7/2012 | Kashiwakura |
| 8,354,601 B2 | 1/2013 | Russell |
| 8,497,433 B2 | 7/2013 | Morgan |
| 8,502,085 B2 | 8/2013 | Kim |
| 8,560,296 B2 | 10/2013 | Norte |
| 8,723,048 B2 | 5/2014 | Wu et al. |
| 8,957,325 B2 | 2/2015 | Hidak et al. |
| 8,994,480 B2 * | 3/2015 | Kushta ................ H05K 1/0251 333/204 |
| 9,107,300 B2 | 8/2015 | Kushta |
| 9,119,334 B2 | 8/2015 | Mutnury et al. |
| 9,362,603 B2 | 6/2016 | Kushta |
| 2005/0224912 A1 | 10/2005 | Rogers et al. |
| 2006/0131611 A1 | 6/2006 | Kaluzni et al. |
| 2007/0193775 A1 | 8/2007 | Chen et al. |
| 2008/0101050 A1 | 5/2008 | Fung |
| 2009/0015345 A1 | 1/2009 | Kushta et al. |
| 2014/0326495 A1 | 11/2014 | Paniagua |
| 2016/0174359 A1 | 6/2016 | Coletrane et al. |
| 2017/0150594 A1 | 5/2017 | Jones et al. |
| 2017/0196079 A1 | 7/2017 | Morgan et al. |
| 2017/0215274 A1 | 7/2017 | Yan et al. |
| 2017/0229408 A1 | 8/2017 | Murugan et al. |
| 2017/0346195 A1 | 11/2017 | Yamamoto et al. |
| 2018/0049312 A1 | 2/2018 | Gailus et al. |

* cited by examiner

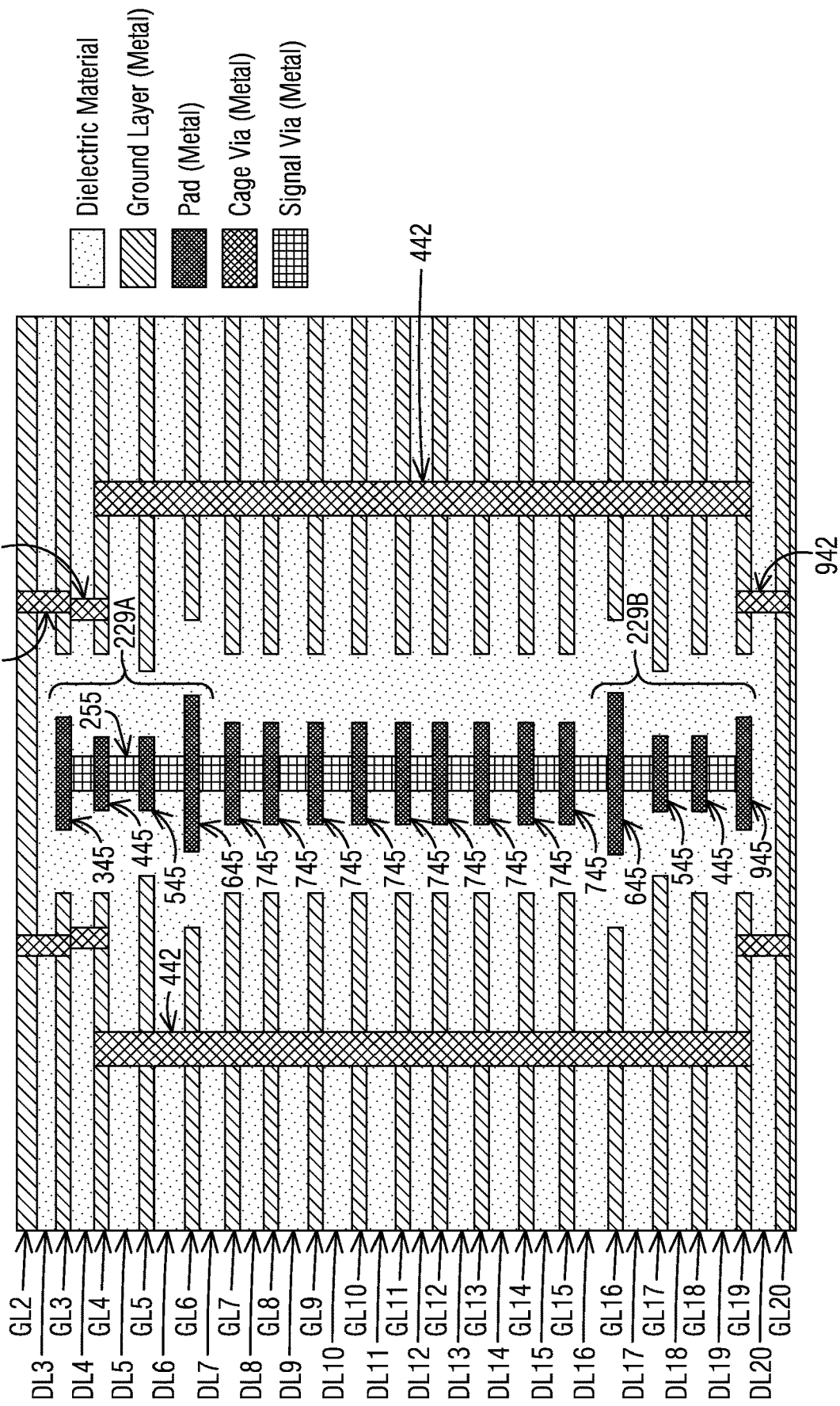

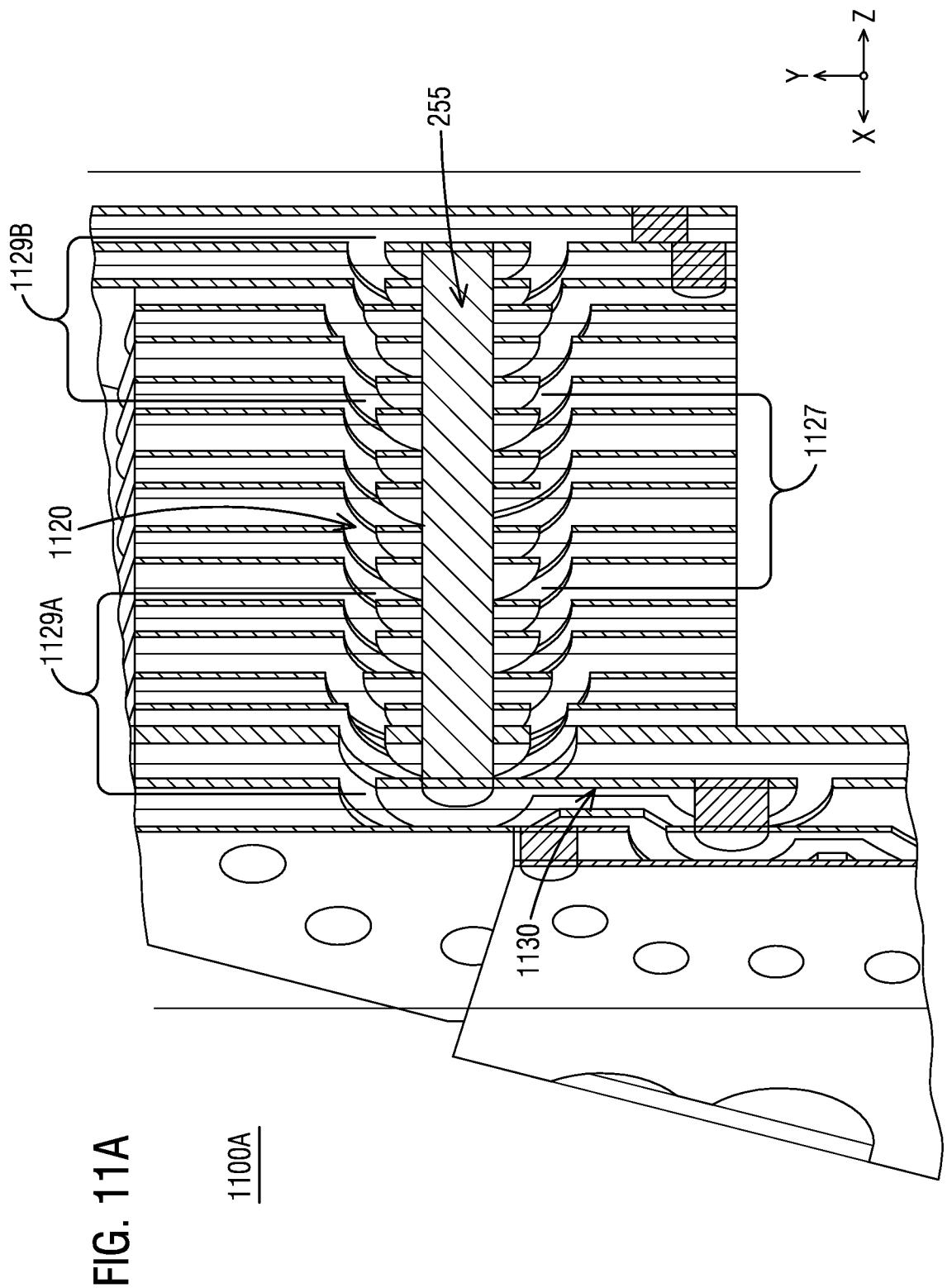

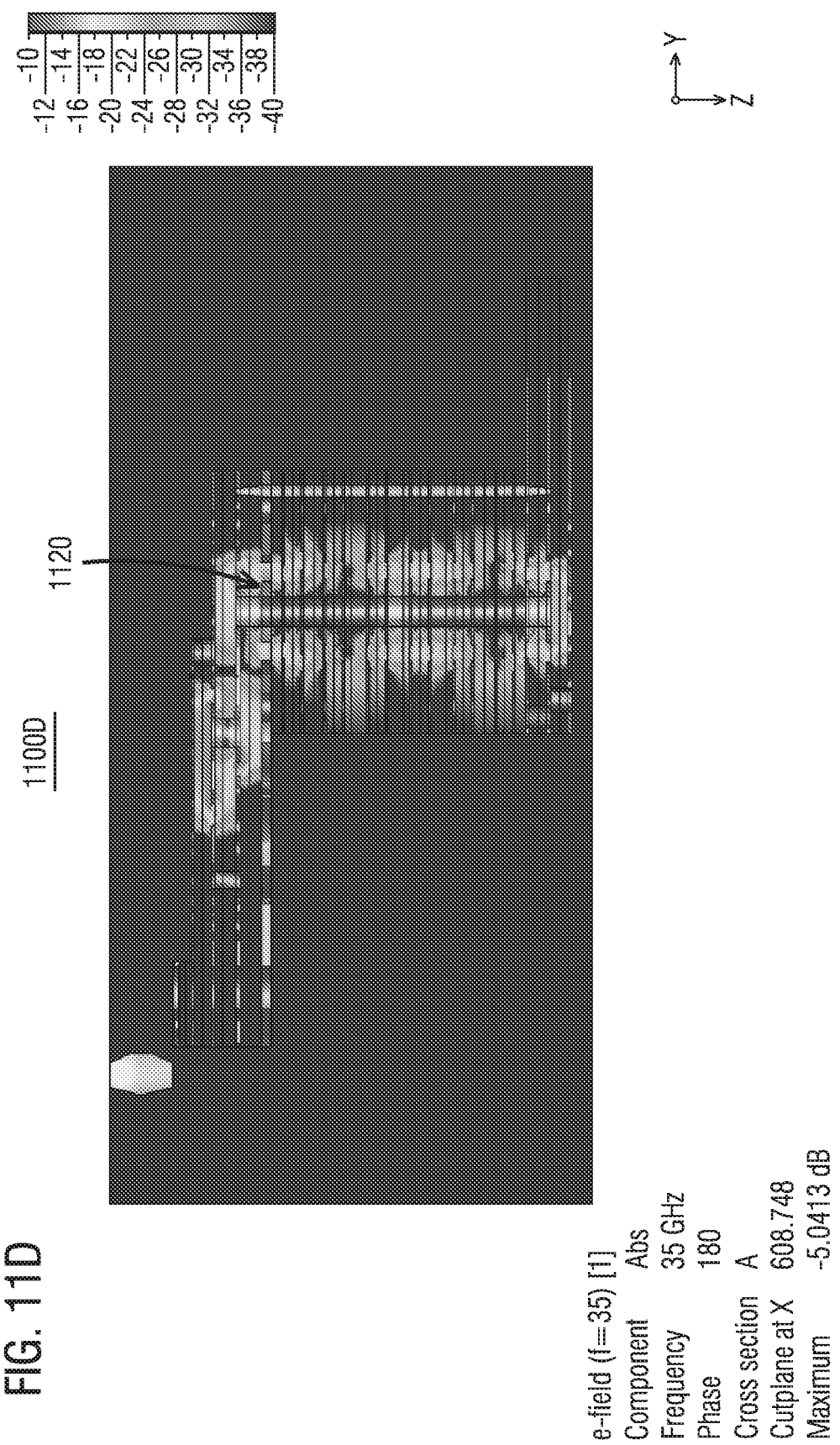

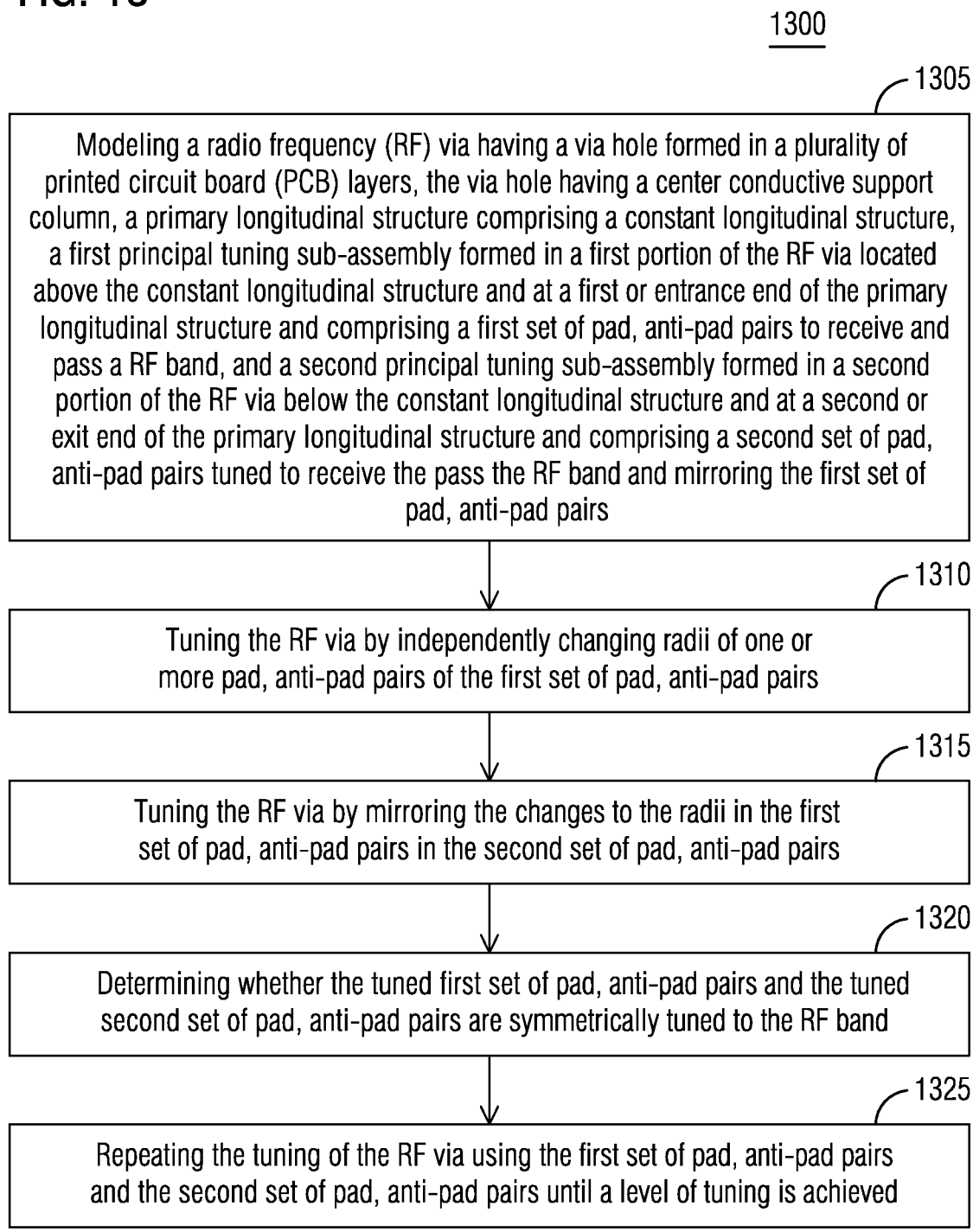

APPARATUS AND METHOD FOR IMPEDANCE BALANCING OF LONG RADIO FREQUENCY (RF) VIA

CROSS-REFERENCE TO RELATED APPLICATIONS

This application claims priority benefit to U.S. Provisional Application No. 62/772,824, titled "APPARATUS AND METHOD FOR IMPEDANCE BALANCING OF LONG RADIO FREQUENCY (RF) VIA" filed Nov. 29, 2018, the entirety of which is incorporated by reference.

BACKGROUND

Embodiments relate to an apparatus and method for impedance balancing of long radio frequency (RF) via.

Increasingly complex, multi-level, thick and densely packed PCBs requiring long RF signal routes suffer from complex and often large impedance imbalances due to their long routes and multiple transitions especially at high frequency bands such as Ku (frequencies from 12 to 18 gigahertz (GHz)) and Ka (frequencies in the range 26.5-40 gigahertz (GHz)). This leaves conventional methods such as quarter wave stubs to be employed along the trace to mitigate losses, however in increasing challenging densely packed routings this may not be practical and in some cases impossible to accomplish.

To address long via impedance matching, conventional methods used are to place tuning stubs, some significantly long and wide, and to straighten out the signal pathways leading into and out of a long transitional via while also limiting multiple stacked jogs of transitions. However, this method breaks down when the circuit card is significantly populated with signal traces thereby reducing the area available for stub placement or, in some instances, outright eliminating available areas for stub placement. Once that area is removed or limited it is then impossible to balance out the transition leading to unacceptable signal blockage or attenuation.

SUMMARY

Embodiments relate to an apparatus and method for impedance balancing of long radio frequency (RF) via.

An aspect of the embodiments includes an apparatus comprising a stack of printed circuit board (PCB) layers having a primary longitudinal structure forming a radio frequency (RF) via including a principal tuning section and a constant longitudinal structure along a conductive column support journaled through the PCB layers in the via. The principal tuning section comprising a first principal tuning sub-assembly in a first portion of the RF via located above the longitudinal structure and at an entrance end of the primary longitudinal structure and comprising a first set of pad, anti-pad pairs tuned to receive and pass an RF band. A second principal tuning sub-assembly in a second portion of the RF via below the longitudinal structure and at an exit end of the primary longitudinal structure and comprising a second set of pad, anti-pad pairs tuned to receive and pass the RF band and mirroring the first set of pad, anti-pad pairs.

Another aspect of the embodiments includes a tangible and non-transitory computer readable medium having program instructions which when executed by one or more processors causes the one or more processors to: model a radio frequency (RF) via having a via hole formed in a plurality of printed circuit board (PCB) layers. The via hole of the model has a center conductive support column, a primary longitudinal structure comprising a constant longitudinal structure and a first principal tuning sub-assembly formed in a first portion of the RF via located above the constant longitudinal structure and at a first or entrance end of the primary longitudinal structure. The first principal tuning sub-assembly comprises a first set of pad, anti-pad pairs to receive and pass an RF band. The RF via has a second principal tuning sub-assembly formed in a second portion of the RF via below the constant longitudinal structure and at a second or exit end of the primary longitudinal structure and comprising a second set of pad, anti-pad pairs tuned to receive and pass the RF band and mirroring the first set of pad, anti-pad pairs. The one or more processors to tune the model by independently changing radii of one or more pad, anti-pad pairs of the first set of pad, anti-pad pairs; and tune the model by mirroring the changes to the radii in the first set of pad, anti-pad pairs in the second set of pad, anti-pad pairs. The one or more processors to determine whether the tuned first set of pad, anti-pad pairs and the tuned second set of pad, anti-pad pairs are symmetrically tuned to the RF band; and repeat the tuning of the model using the first set of pad, anti-pad pairs and the second set of pad, anti-pad pairs until a level of tuning is achieved.

A still further aspect of the embodiments includes a method comprising modelling a radio frequency (RF) via having a via hole formed in a plurality of printed circuit board (PCB) layers. The via hole has a center conductive support column, a primary longitudinal structure comprising a constant longitudinal structure and a first principal tuning sub-assembly formed in a first portion of the RF via located above the constant longitudinal structure and at a first or entrance end of the primary longitudinal structure. A first set of pad, anti-pad pairs receive and pass an RF band of the first principal tuning sub-assembly. A second principal tuning sub-assembly is formed in a second portion of the RF via below the constant longitudinal structure and at a second or exit end of the primary longitudinal structure. The second principal tuning sub-assembly comprises a second set of pad, anti-pad pairs tuned to receive and pass the RF band and mirroring the first set of pad, anti-pad pairs. The method comprises tuning the RF via by independently changing radii of one or more pad, anti-pad pairs of the first set of pad, anti-pad pairs; and tuning the RF via by mirroring the changes to the radii in the first set of pad, anti-pad pairs in the second set of pad, anti-pad pairs. The method comprises determining whether the tuned first set of pad, anti-pad pairs and the tuned second set of pad, anti-pad pairs are symmetrically tuned to the RF band; and repeating the tuning of the RF via using the first set of pad, anti-pad pairs and the second set of pad, anti-pad pairs until a level of tuning is achieved.

BRIEF DESCRIPTION OF THE DRAWINGS

A more particular description briefly stated above will be rendered by reference to specific embodiments thereof that are illustrated in the appended drawings. Understanding that these drawings depict only typical embodiments and are not therefore to be considered to be limiting of its scope, the embodiments will be described and explained with additional specificity and detail through the use of the accompanying drawings in which:

FIG. 2D illustrates a cross-section of a partial three-dimensional view (3D) of the long RF via;

FIG. 11A illustrates the long RF via with the top principal tuning section blocked along with some of the layers of the constant longitudinal structure;

FIG. 11D illustrates a balanced impedance signature along the length of the long RF via of FIG. 11C;

FIG. 13 illustrates a flowchart of a method for tuning an RF via model.

DETAILED DESCRIPTION

Figure 1A:
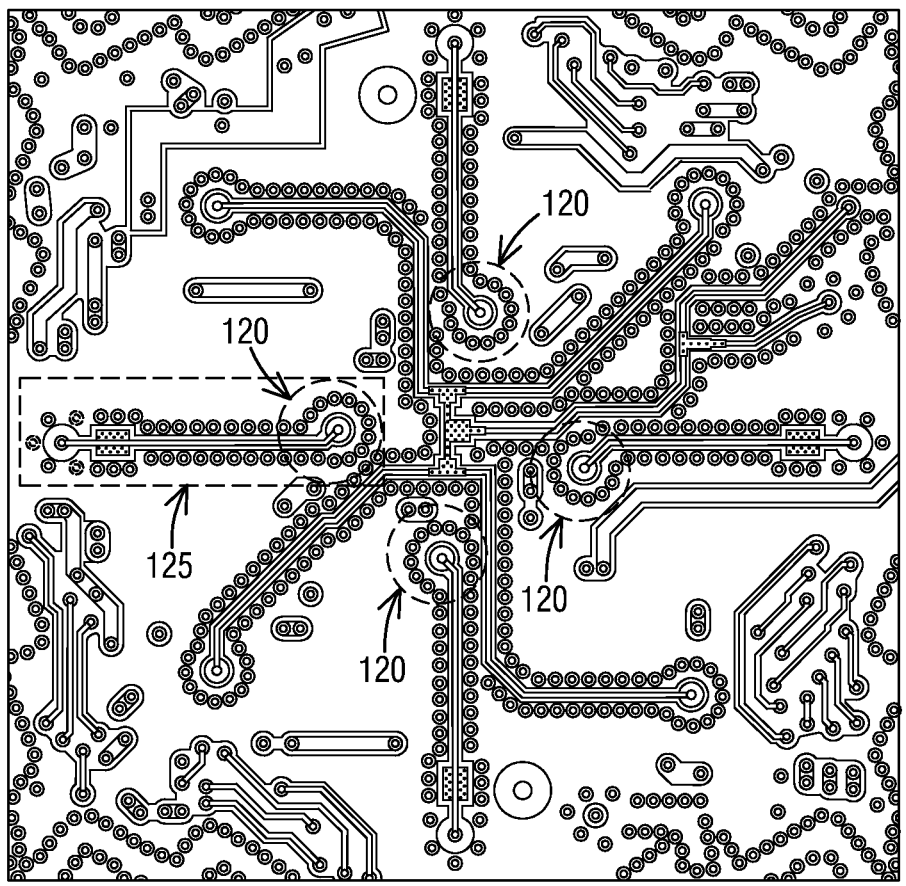
FIG. 1A illustrates a top view of an apparatus with a multi-level, printed circuit board (PCB) assembly with a plurality of radio frequency (RF) in/out long signal vias.

Embodiments are described herein with reference to the attached figures. The figures are not drawn to scale and they are provided merely to illustrate aspects disclosed herein. Several disclosed aspects are described below with reference to non-limiting example applications for illustration. It should be understood that numerous specific details, relationships, and methods are set forth to provide a full understanding of the embodiments disclosed herein. One having ordinary skill in the relevant art, however, will readily recognize that the disclosed embodiments can be practiced without one or more of the specific details or with other methods. In other instances, well-known structures or operations are not shown in detail to avoid obscuring aspects disclosed herein. The embodiments are not limited by the illustrated ordering of acts or events, as some acts may occur in different orders and/or concurrently with other acts or events. Furthermore, not all illustrated acts or events are required to implement a methodology in accordance with the embodiments.

Notwithstanding that the numerical ranges and parameters setting forth the broad scope are approximations, the numerical values set forth in specific non-limiting examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 4.

Major blockage of antenna energy may be due to transitions from a long signal via to the radio frequency (RF) trace either from the guide/divider side or out to the circuit. By way of non-limiting example, deconstructing the signal to the trace-out route may be a cause of interference.

The embodiments herein provide a method for preserving signal integrity and minimizing reflection losses in a spatial printed circuit board (PCB) environment via pads, anti-pads and caging via structures.

The method may allow the energy transported by, for example, an (exceptionally) long via trace to be balanced within the confines of a relatively small footprint by employing pads and anti-pads patterned and mirrored along the via path. The term "exceptionally" long may include multiple layers in the range of 15-20 layers, 15-30 layers, 15-40 layers, or 20 plus layers. However, a long via trace may include 15 or more layers. This may allow the signal to balance out along the pathway, resist destructive reflection mechanisms, and to be mitigated. The RF via is designed to reduce or even eliminate the need for signal stubs. The method uses a patterned use of pads, anti-pads and relative cage via placement to create destructive and constructive wave mechanics along the long RF via transition to match the impedance across/along the distance at a frequency. This method allows the designer to match performance to the desired frequency of performance and, in some embodiments, with relatively wide bandwidth depending on performance needs.

The long RF via according to the principles herein may allow for compact spatial balancing of signals along a long via path length (relative with frequency and board thickness) which cannot be done using conventional stubbing techniques. The long RF via according to the principles herein may allow for frequency and bandwidth selection and performance based on the specific needs of the system and for the tolerance capabilities of the manufacturer.

The long RF via pattern is configurable for each situation. The method of forming the long RF via provides a plurality of degrees of freedom related to the number of pads, pad sizes, anti-pad sizes, symmetry and the cage vias to create matched impendence balancing along the pathway of the long RF via. The cage vias generally are not used by engineers and view the cage via as a throw away item.

However, in the embodiments herein, the cage vias may be a design parameter to achieve tuning or impedance matching.

In some embodiments, the long RF via contains first and second sets of tuning pads for impedance matching, wherein the first and second sets are diametrically opposing or mirroring. Specifically, the first and second sets of tuning pads may include two dimensionally-different pads. Essentially the first set of pads at the leading end into the long RF via are essentially mirrored in a second set of pads at the exit end of the long RF via.

Basic Structure Construction

FIG. 1A illustrates a top view of an apparatus having a multi-level, printed circuit board (PCB) 100A with a plurality of radio frequency (RF) in/out channels 125. In the illustrated example, there are four transmit signals located in the center of the board. The RF in/out channels 125 in the illustrated example are essentially the same. The long RF via 120 is denoted in the circle and provides balanced impedance tuning for the long RF pathway through a long RF via 120. The long RF via 120 may be employed to eliminate the need for the clearance requirements, such as 4 mil, with the minimum distance being approximately 5 mil via passing from PCB layers (i.e., layers L3 to L20 of FIG. 2A), for example.

Since, the RF in/out channels 125 is essentially identical for the sake of brevity only one RF in/out channel 125 will be described in detail.

Figure 1B:
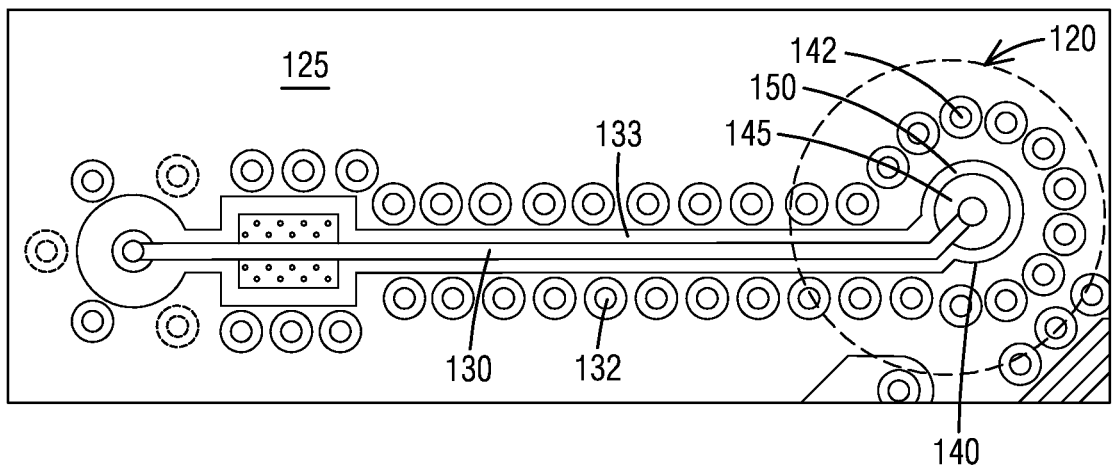
FIG. 1B illustrates a top view of an RF in/out channel of FIG. 1A.

FIG. 1B illustrates a top view of an RF in/out channel 125 of FIG. 1A. The RF in/out channel 125 includes an RF signal trace 130 having a length. One end of the RF trace 130 is coupled to a long RF via 120. In some embodiments, the RF trace 130 is an RF entrance trace 130 delivering an RF signal to a pad of the long RF via 120. The other end of the RF trace 130 may also be coupled to a via which will not be described as it is not part of the invention. However, for the purpose of this embodiments, the long RF via 120 will be described in detail later. Along the length of the RF trace 130, a plurality of cage vias 132 are arranged on opposing sides of the longitudinal length of the RF trace 130. Additionally, the length of the RF trace 130 is separated from the circuit board by anti-pad channels 133 on opposing sides of the RF trace 130. Anti-pad channels 133 may be filled with a dielectric.

The long RF via 120 may include a plurality of cage vias 142 circling the annulus 140 of the long via 120. The annulus 140 may have varying diameter dimensions between layers, as best seen in FIG. 2D. Furthermore, each layer has two levels, a top dielectric level layer and a ground level layer, the ground layers of the via may have one or more varying annulus diameters. The RF trace 130 is illustrated terminating at pad 145 of a predetermined PCB layer. The pad 145 is surrounded by anti-pad space 150. The anti-pad space 150 comprises empty space between the perimeter edge of the pad 145 and the inner surface of the ground layer filled with a dielectric. As will be seen in FIG. 2D, the space between ground layers corresponds to the dielectric layer. The anti-pad space 150 of the dielectric layer to the center support column 255, best seen in FIG. 2D, is generally the same for each dielectric level layer.

Figure 1C:
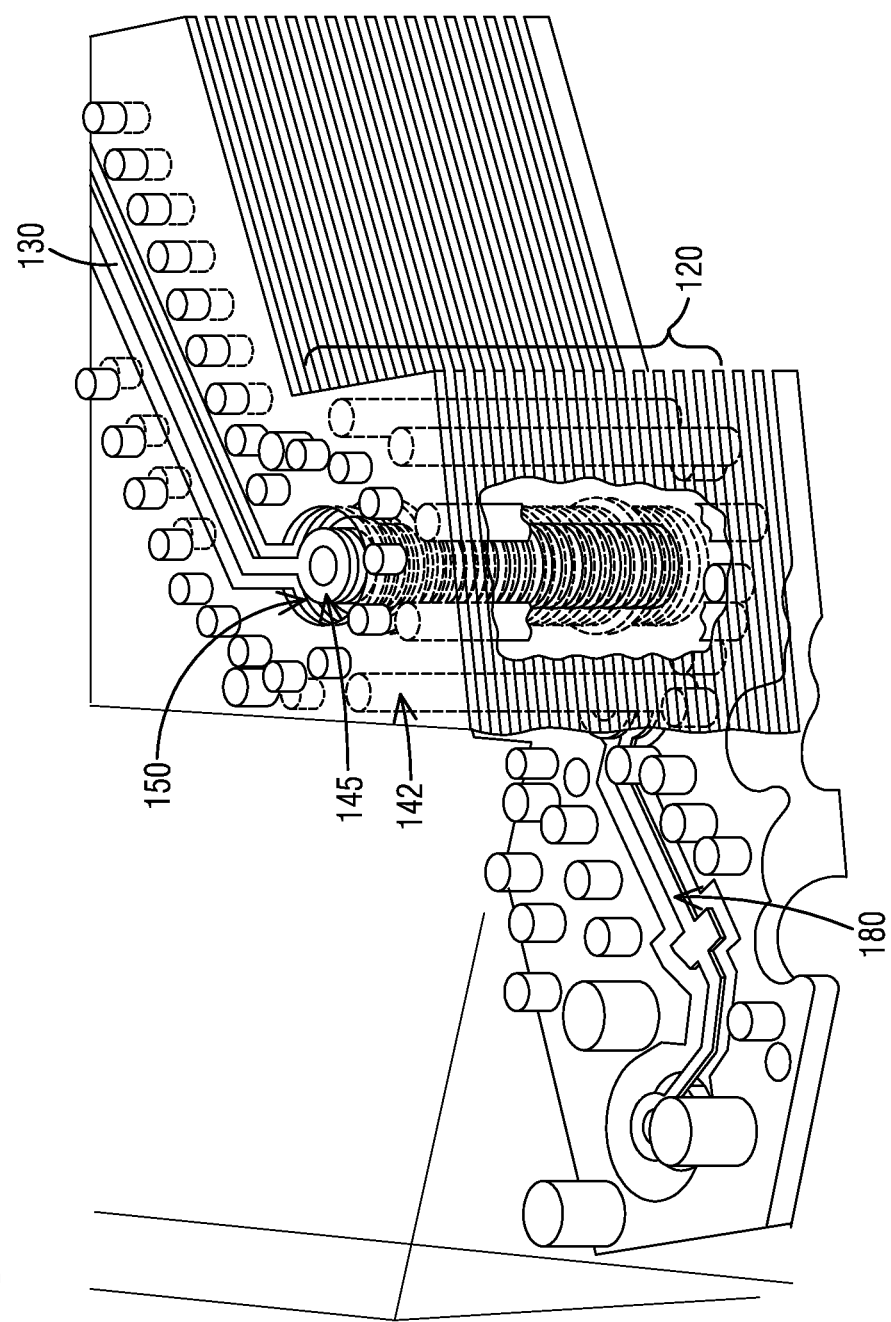
FIG. 1C illustrates a partial three-dimensional (3D) view of the multi-level, printed circuit board (PCB) assembly with a long RF signal via of FIG. 1A.

FIG. 1C illustrates a partial three-dimensional (3D) view of the multi-level, printed circuit board (PCB) assembly with a long RF signal via 120 of FIG. 1A, therefore like reference numeral in some instances will not be described although shown in the figure. The terms long RF via and long RF signal via will sometimes be used interchangeably herein. The 3D view illustrates an RF exit trace 180 emanating from a lower end of the long RF via 120. The 3D view illustrates multiple columns of stacked cage vias 142 generally equally distant from each other around a virtual via boundary of the RF long via 120, as will be described later. In some embodiments, the cage vias 142 may be stacked and/or aligned from one layer to the next layer.

The arrangement of the cage vias 142 may not be symmetric or mirrored due to the manufacturing rules and other structures proximate the long RF via 120 in the primary tuning structures. The cage via 142 is another degree of freedom for balancing and tuning.

Figure 2A:
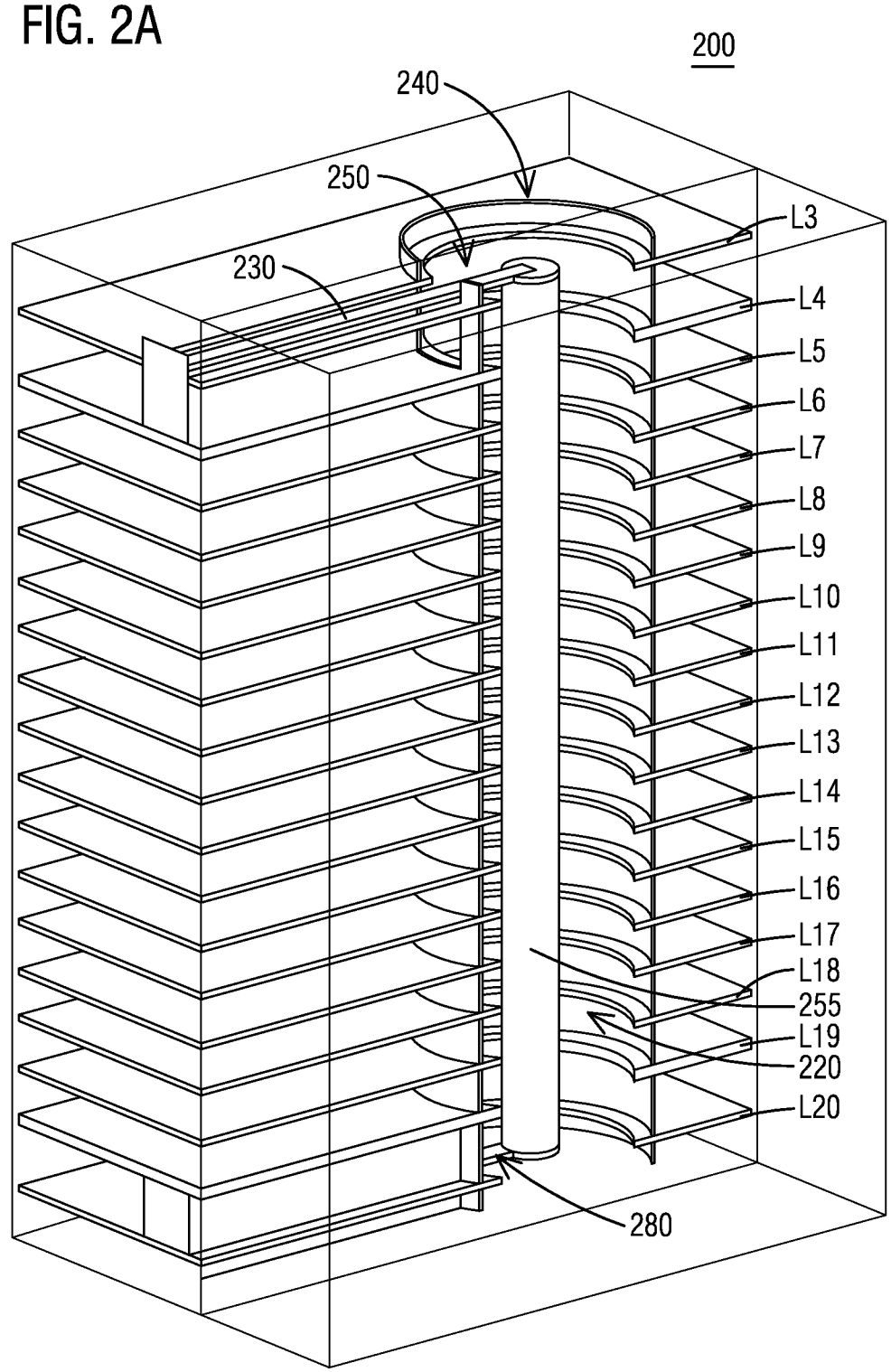
FIG. 2A illustrates a partial three-dimensional (3D) view of the via annulus and center support column of the long RF via without pads within a multi-level PCB assembly.

FIGS. 2A-2D illustrate various 3D views of the multi-level PCB assembly 200 and the long RF via. Specifically, FIG. 2A illustrates a partial three-dimensional (3D) view of the via annulus and center support column of the long RF via without pads within a multi-level PCB assembly. In FIG. 2A, the multi-level PCB assembly 200 is illustrated with at least layers L3-L20 for discussion purposes. The multi-level PCB assembly 200 is not limited to 20 layers as there may be more than 20 layers. There may be slightly less than 20 layers. The nomenclature L # corresponds to the sequentially ordered stack of multi-level PCB assembly 200. The RF signal entering on RF entrance trace 230 travels down the long RF via 220 to the RF exit trace 280.

The RF long via 220 is formed by a via annulus having journaled along its longitudinal center, a support column 255 extending from the layer L3 down to at least L19 or L20 wherein anti-pad 250 is formed between the via annulus and the outer perimeter of the support column 255 generally cylindrically shaped. The refinements to the anti-pad space 250 will be described in more detail in relation to FIGS. 2D, 3A, 4-7 and 9-10. The support column 255 is an electrical conduit for the propagation, transfer and conductivity of the RF signal entering on RF entrance trace 230 down the long RF via 220 to the RF exit trace 280. While layers L2 and L20 are shown, these layers in this specific representation are not part of the RF long via 220 but shown for completeness.

Figure 2B:
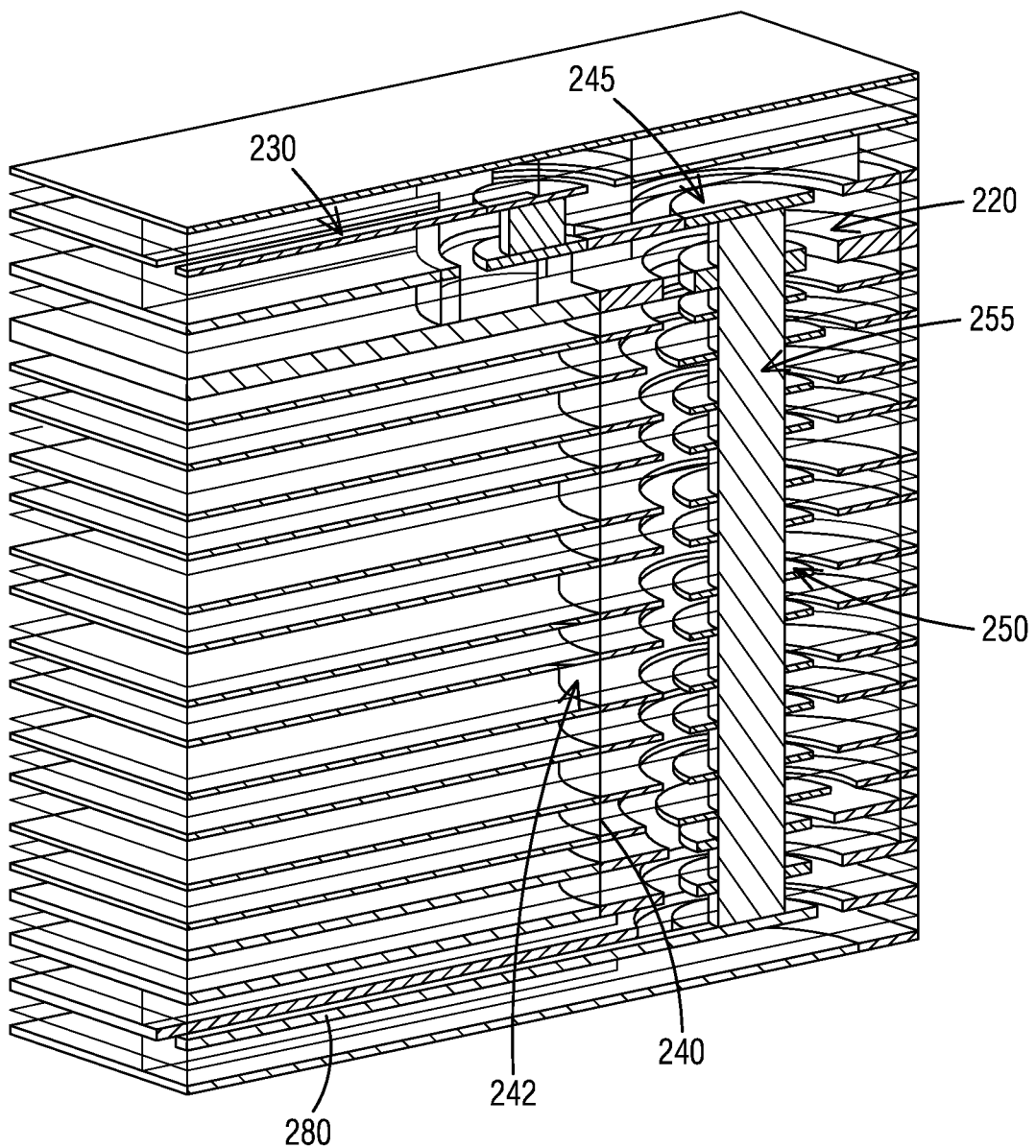
FIG. 2B illustrates a partial three-dimensional (3D) view of the via of FIG. 2A with pads illustrated.
Figure 2C:
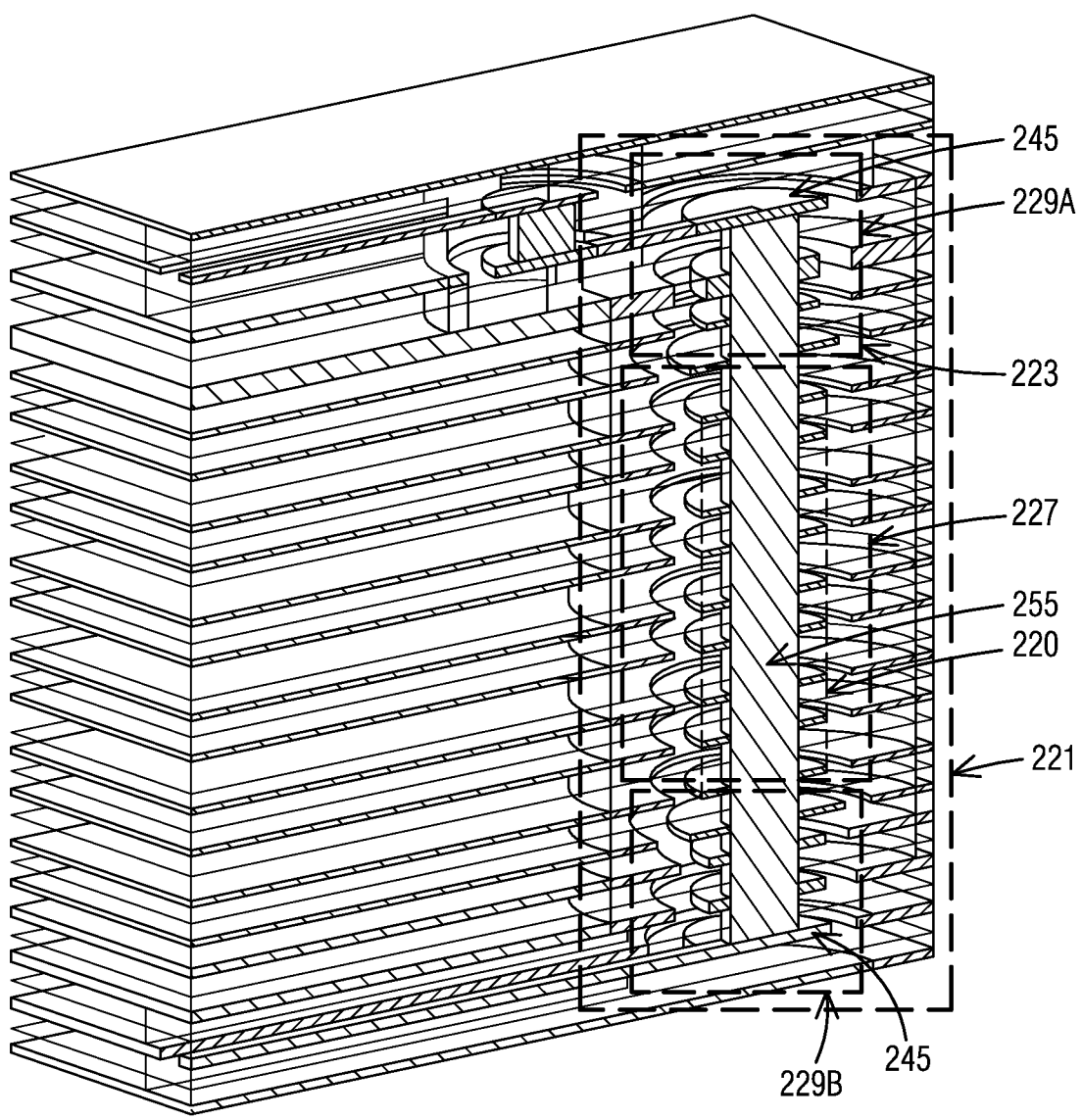
FIG. 2C illustrates the partial three-dimensional view (3D) of the via of FIG. 2B with the principal tuning section, primary longitudinal structure and the constant longitudinal structure shown.

FIG. 2B illustrates a partial three-dimensional (3D) view of the via of FIG. 2A with pads illustrated. FIGS. 2B and 2C add the tuning pads 245 to the long RF via 220. Thus, only the differences relative to FIG. 2A will be described in detail. The primary longitudinal structure 221 (FIG. 2C) is generally symmetrical. The symmetry in the primary longitudinal structure 221 may support a subdivision of the via layers L3-L19 into two primary constituent parts, the principal tuning section 223 and the constant longitudinal structure 227. The principal tuning section 223 may include a first principal tuning sub-assembly 229A and a second principal tuning sub-assembly 229B. The first principal tuning sub-assembly 229A is located at a first or entrance end of the primary longitudinal structure 221. The second principal tuning sub-assembly 229B is located at a second or exit end of the primary longitudinal structure 221.

Figure 3A:
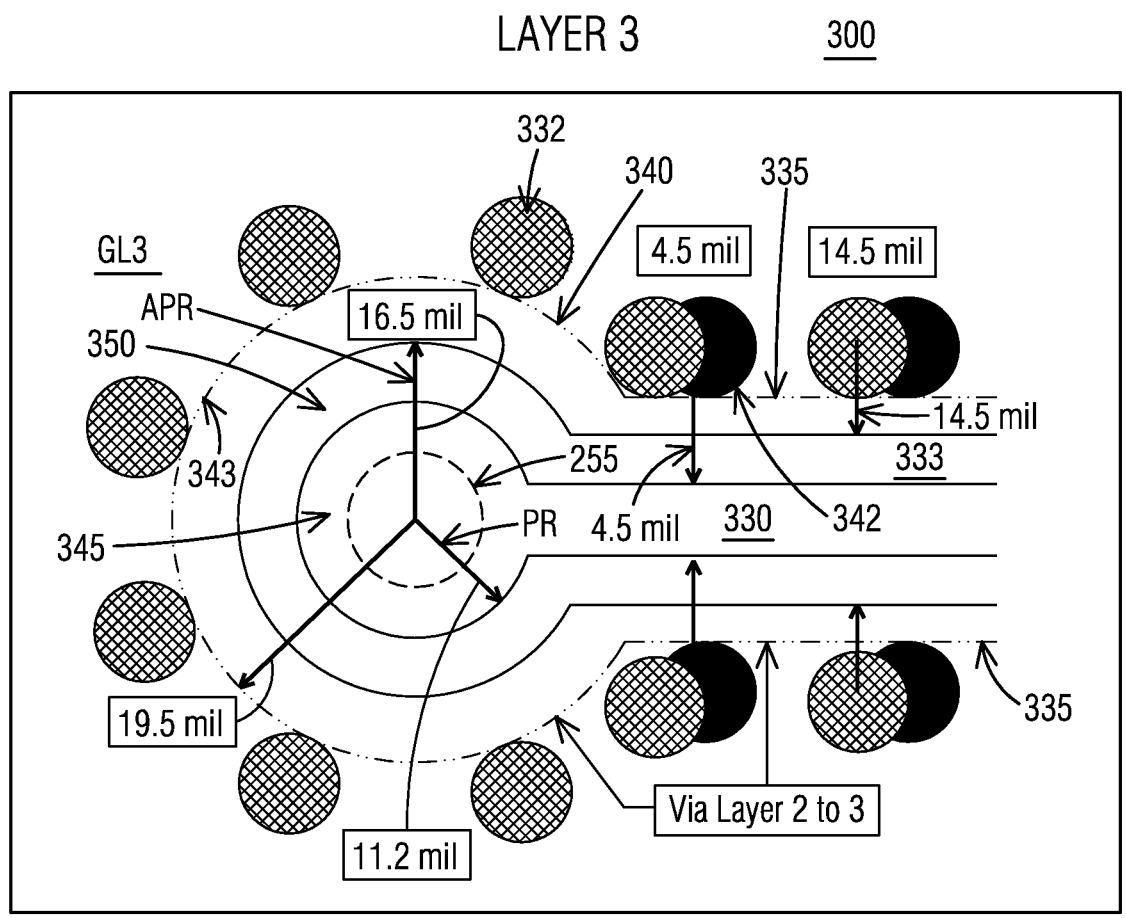
FIG. 3A illustrates a top view of the long RF via about the $3^{rd}$ layer of the PCB.
Figure 3B:
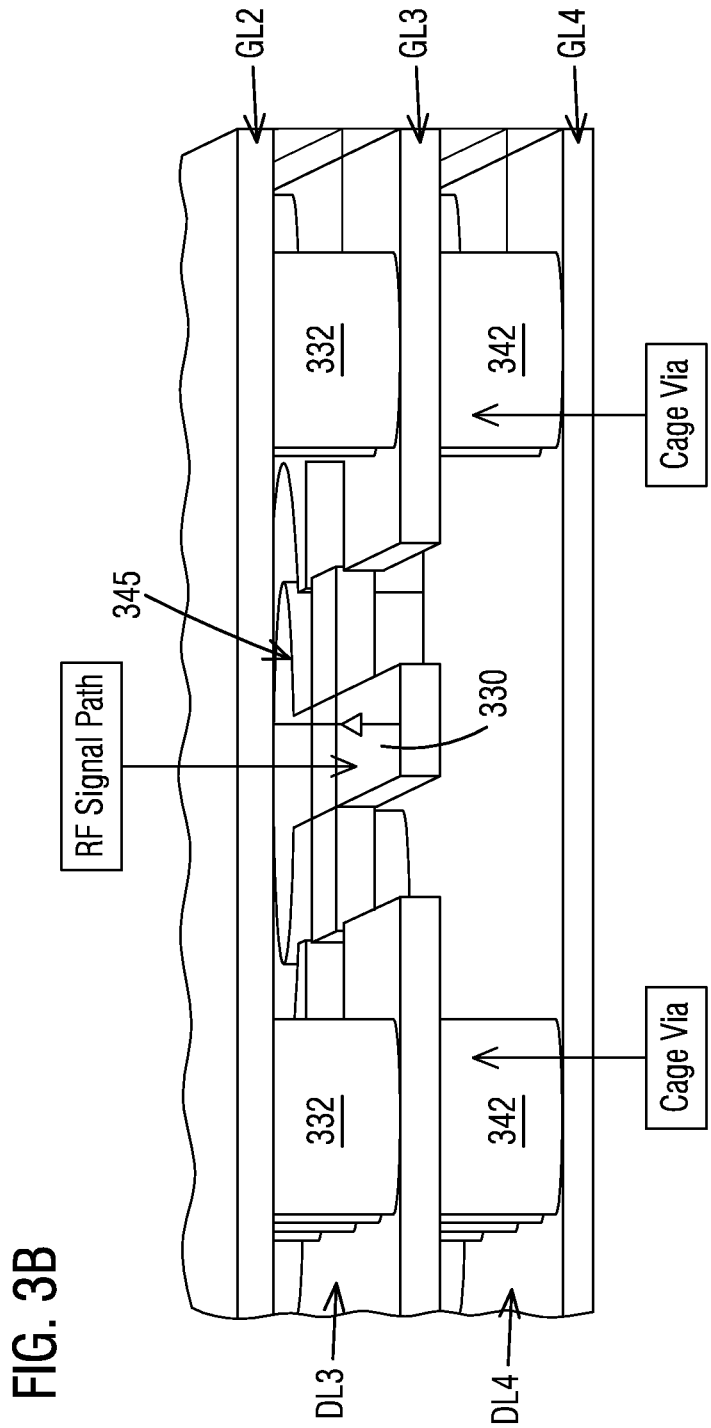
FIG. 3B illustrates a partial side view of the long RF via about the $3^{rd}$ layer of the PCB.

As will be seen in FIGS. 3A, 3B, 4-7, 9 and 10, the cage vias 242 may be located to be tangential to the virtual via boundary 240 associated with the ground layer or dielectric of the plurality of printed circuit board (PCB) layers L3-L20, by way of non-limiting example. Each cage via as best seen in FIG. 3B will extend between the ground layer of the previous PCB layer and the ground layer of the next PCB layer below and through the dielectric layer therebetween. The virtual via boundary 240 may be associated with either the dielectric layer or ground layer. The virtual via boundary 240 serves as a virtual representation of the cage vias, electrically this is the tangential circle of the cage vias (such as cage vias 242) faces.

Assume that the long RF via 220 has a variable dumbbell pattern such that each end includes varying pad sizes and anti-pad sizes to tune the long RF via to the desired radio frequency or frequency band. Assume that FIG. 2A represents a starting dumbbell pattern. The starting dumbbell pattern has no pattern only the column support 255. A first subset of layers of the plurality of layers through which the column support 255 is journaled, at the first end, has multiple degrees of freedom which may be mirrored at a second subset of layers of the plurality of layers to balance the impedance of the long RF via 220 to receive an RF signal of a particular frequency or band. Thus, the dumbbell pattern may be built to create the first and second principal tuning sub-assemblies 229A and 229B which are diametrically opposing or mirrored. The first subset of layers and the second subset of layers combined are less than the plurality of layers. In some embodiments, the number of layers of the constant longitudinal structure 227, between or separating the first subset of layers of first principal tuning sub-assembly 229A and second subset of layers of second principal tuning sub-assembly 229B, may be odd or even numbered.

FIG. 2D illustrates a cross-section of a partial three-dimensional view (3D) of the multi-level PCB assembly 200 and the long RF via without the RF entrance/exit traces. FIG. 2D illustrates a dumbbell pattern. The PCB assembly includes a plurality of sequentially stacked PCB layers L3-L20 (FIG. 2A). Using the nomenclature PCB layer L # includes a ground layer GL # and dielectric layer DL #, ground layers GL3-GL20 are shown between dielectric layers DL3-DL20. A respective one PCB layer comprises a bottom layer and a top layer. The bottom layer is the ground level layer denoted as a diagonally hatched pattern. The top layer is the dielectric level layer denoted as a dotted pattern. In FIG. 2D, PCB layers L3, L4, L5 and L6 are labeled which serve as the first principal tuning sub-assembly 229A of the dumbbell pattern. The PCB layers L16, L17, L18 and L19 are labeled which serve as the second principal tuning sub-assembly 229B of the dumbbell pattern. These tuning sub-assemblies mirror each other.

The dielectric layers may be made of a dielectric material such as, without limitation, epoxy resin bonded glass fabric (ERBGF) like FR-4, synthetic resin bonded paper (SRBP), ceramic, phenol-based resin or Teflon. The ground layers may be made of metal or conductive material. The support column 255 is made of metal or conductive material. The support column 255 is represented in a square hatch pattern. While only two layers of each PCB layer L3-L20 are shown, the dielectric layer and the ground layer may be bonded or laminated to each other using known manufacturing processes. Any voids are filled with board dielectric material. The voids include, for example, the anti-pad space and space between ground layers.

Figure 9:
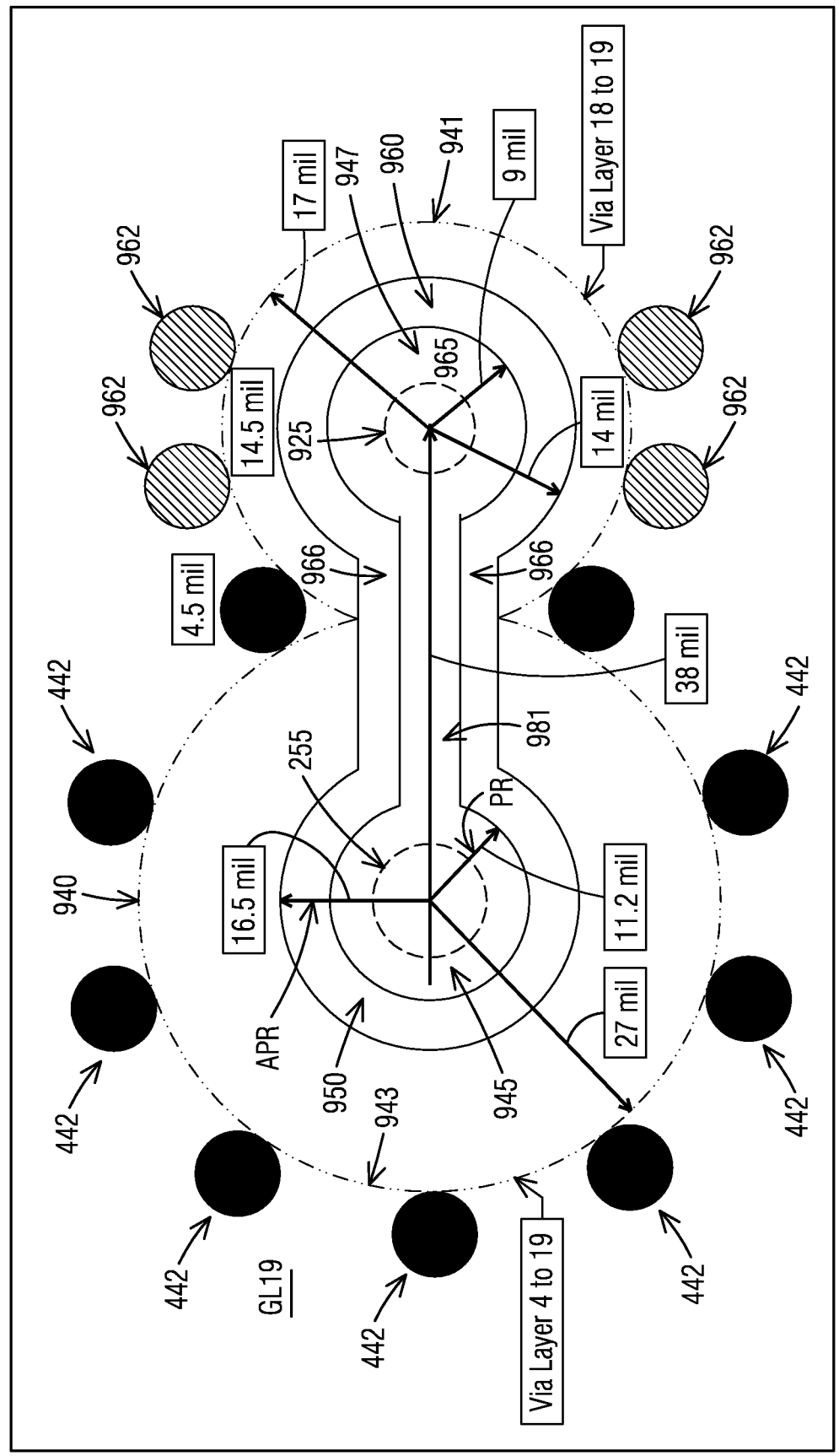
FIG. 9 illustrates a top view of the $19^{th}$ layer of the PCB and long RF via with cage vias.

The symmetry and placement of the pads and anti-pad may be the primary drivers for impedance balancing and tuning. The proximity of cage via 142 (FIG. 1C) may be a secondary driver. The principal tuning section 223 includes pad 345 (FIG. 3A) in the PCB layer L3 of the first principal tuning sub-assembly 229A and pad 945 (FIG. 9) in the PCB layer L19 of the second principal tuning sub-assembly 229B. The dimensions of pad 345 and pad 945 are essentially identical or mirrored, as can be seen in FIGS. 3A and 9. The pads in the RF via each has a thickness corresponding to a thickness of the ground layer.

The principal tuning section 223 includes pad 445 (FIG. 4) in the PCB layer L4 of the first principal tuning sub-assembly 229A and the PCB layer L18 of the second principal tuning sub-assembly 229B. The principal tuning section 223 includes pad 545 (FIG. 5) in the PCB layer L5 of the first principal tuning sub-assembly 229A and the PCB layer L17 of the second principal tuning sub-assembly 229B. The principal tuning section 223 includes pad 645 (FIG. 6) in the PCB layer L6 of the first principal tuning sub-assembly 229A and the PCB layer L16 of the second principal tuning sub-assembly 229B.

The PCB layers L3 and L19 of the principal tuning section 223 have generally the same pad and anti-pad dimensions. However, PCB layer L19 includes a short RF transition trace 981 (FIG. 9) to PCB layer L20 (FIG. 10) which is due to a crossing trace that drives the transition of the RF trace on PCB layer L19 rather than continue to PCB layer L20 (FIG. 2A). The transition of the signal to PCB layer L20 is accomplished outside of the long RF via 220.

The constant longitudinal structure 227 includes PCB layers L7-L15 (FIG. 2A) corresponding to ground layers GL7-GL15 and dielectric layers DL7-DL15. In some embodiments, the pads for layers L7-L15 may be omitted. In other embodiments, layers L7-L15 may include pads which are all the same size or identical.

The length of the long RF via path provides a loss. The embodiments herein alleviate this loss along the via path by using a combination of pads, anti-pads and cage vias to balance the RF signal and symmetry to reduce loss factors. The process for basic construction (BC), hereinafter referred to as BC process, is governed by the rules of manufacturing in the degrees of freedom. Manufacturing rules guide the order of precedence for the tuning process. Primary design factors are the pad and anti-pad setting with loose cage via placement. Once primary factors are in place secondary effects are established by moving a cage via 442 around the virtual via boundary such that the cage via 442 is tangential to the curvature of the via boundary outside of the area of the space defining the anti-pad. The cage vias 442 are represented in a diamond hatched pattern. The cage vias 342 and 332 are also represented as a diamond hatch pattern. The cage via 332 and 342 will be described in more detail in relation to FIGS. 3A-3B. The cage via 942 is represented as a diamond hatch pattern will be described in more detail in relation to FIG. 10. Moving one cage via may move other by an equal amount relative to the center of the RF via 120 or 220. In other words, the cage vias 442 are placed in the dielectric layer outside of, but tangential to, the region of the via boundary 440. The translational length of the RF via 220 itself causes transmission loss on the signal due to impedance mismatches between the via and the surrounding ground. The RF via traversing such a long distance is known as a loss mechanism. The entrance and exit trace components can be balanced separately. Balancing can be accomplished first at the long trace and then the exit and entrance paths.

Manufacturing processing rules govern the placement and development of internal PCB structures such as pads, anti-pads, traces and cage vias. Primary construction influences the degree of loss. The tuning method uses electromagnetic simulation solvers. Finally, the PCB assembly layout may be checked and validated in electromagnetic simulation solvers.

The BC process will now be described. The BC process may include determining the pad's size minimum and maximum radii possible. The radii of the pads have constraints as the result of the PBC circuitry on each dielectric layer. Additionally, in the BC process a determination is made whether pads can be removed. The BC process may include determining the anti-pad's size minimum and maximum radii possible. Additionally, the BC process may include determining cage via tangency (tangential) location for each individual cage via.

The construction of the cage via 442 may include determining a construction method such as drill, laser and fill/no fill. Furthermore, for the cage via, a barrel or cylinder radii, longitudinal length of via (start/stop layer) definition and barrel placement and construction method may be determined. For example, lasering the cage via center to center with another cage via below may not be allowed to be placed concentrically. Nonetheless, in some embodiments the long RF via 220 must terminate with a via pad or ground plane connection. The barrel may be hollow or solid. For a hollow barrel, the outer walls are conductive, or the inner filling of the barrel is made conductive or non-conductive. In some embodiments, for etched vias, the shape may resemble a cone. However, the tangential relation is the same electrically as long as the outer mold line is conductive.

In some embodiments, the filling material may be an electrically non-conductive epoxy.

Location of Structures and Obstacles

The BC process may include determining the location of structures and obstacles required for the PCB layout on each layer. Structures and obstacles may include any other circuit components, such as shown in FIG. 1A. For example, the location of entrance and exit RF traces and the relation to other non-RF structures may be determined. The BC process may govern the via coverage (annulus) since entrance and exit zones must maintain a strip-line structure and cage via configuration. For example, the cage via 442 may not interrupt an RF trace path or ground path. Location of die pockets or other void structures may be determined. For example, an RF trace path and a via cannot be exposed to free space or must be kept to a minimum. Ground spades, pins or digital signal traces are used as RF cage vias when structures are unavoidable.

Via Balancing Structure Key Drivers

The pads used herein may be metal pads. The metal pads and anti-pads (gapped areas of etched metal between the pad and ground layer) may be varied to balance the PCB layers of tuning sub-assemblies 229A and 229B such that the pads of the tuning sub-assemblies 229A and 229B are generally mirrored or symmetrical. Middle layers L7-L15 may have no pads, but have uniformed gapping (anti-pads) at the dielectric layer DL7-DL15 and uniformed gapping (anti-pads) at the ground layer GL7-GL15.

Layer L20 in this example is not part of the tuning sub-assemblies, but is shown for completeness of this example structure. The signal at layer L19 may have a transition RF trace coupled to its pad to get to PCB layer L20, as will be described in more detail in FIG. 10.

Design factors of the RF via impendence balancing assembly may include symmetry in the primary longitudinal structure 221 and a starting dumbbell pattern, as best seen in FIG. 2D. While the description herein for the purpose of disclosure and example describes a PCB assembly 200 with 20 layers, the PCB assembly may have more or less layers. However, for a PCB assembly with less PCB layers, the tuning sub-assemblies 229A and 229B may have less layers. For a PCB assembly with more PCB layers, the tuning sub-assemblies 229A and 229B may have more layers. The PCB will be an integrated piece once the board is laminated, but it includes the RF via 220 structure which might be a conductively coated drilled hole and pads that are formed when the copper is etched off the layer it is a part of. So, it is not a true monolith structure, but gets there once the board layers are laminated together.

Each tuning sub-assembly 229A or 229B may include a plurality of tuning layers including pads and anti-pads with two or more degrees of freedom amongst the constituent pad and anti-pads pairs. The degrees of freedom include two or more of radii of the pad, radii of the anti-pad and radii of the annulus of the long RF via, as will be described in more detail in relation to FIGS. 3A-7, 9 and 10. The subset of layers of each tuning sub-assembly 229A or 229B may include, by way of non-limiting example, three (3) or four (4) PCB layers. The layers of the tuning sub-assemblies 229A or 229B are essentially mirrored to form the diametrically opposing configuration or dumbbell pattern. For example, the tuning sub-assemblies of the dumbbell pattern includes the first outer layer on opposing ends of the dumbbell pattern would be mirrored. The next (first) interior layers of the sub-assemblies adjacent to the outer layers are mirrored, so on and so forth. The layers include the via structure, pad, anti-pad and when possible the cage vias which are mirrored. The cage vias are a special case due to their own implementation rules set forth by the manufacturer and obstacles in the layout.

The constant longitudinal structure 227 may include a symmetrical portion of the via transition outside the principal tuning section 223 including a stack of identically dimensioned PCB layers. It should be noted that the constant longitudinal structure 227 may have an odd number of layers or an even number of layers. For an odd layer configuration, the "odd" layer or middle layer of the stack in the constant longitudinal structure 227 can be the hinge point for definition of this structure taken on the pad/anti-pad definitions of the rest of the structure.

The starting patterns (dumbbell design) may include forming a dumbbell design consisting of the principal tuning structures on opposite ends of the constant longitudinal structure 227 tuned to secure the least amount of transmission loss possible. These dumbbell patterns are mirrored copies of one another simplifying the tuning process through mirrored adjustments on paired layers on opposite ends of the dumbbell design. Paired layers include layers L3 and L19, for example. Paired layers may include layers L4 and L18, for example. Paired layers may include layers L5 and L17, for example. Paired layers may include layers L6 and L16, for example.

By way of non-limiting example, an initial configuration of pads for each tuning sub-assembly 229A or 229B may be used as a starting point. For example, the $3^{rd}$ layer pad 345 and the $19^{th}$ layer pad 945 (hereinafter referred to as "PAD1") may have a larger radius than all other pads. The $4^{th}$ layer pad 445 and the $18^{th}$ layer pad 445 (hereinafter referred to as "PAD2") may have a smaller radius than PAD1. The $5^{th}$ layer pad 545 and the $17^{th}$ layer pad 545 (hereinafter referred to as "PAD3") may have a radius smaller than PAD1, but larger than PAD2. The $6^{th}$ layer pad 645 and the $16^{th}$ layer pad 645 (hereinafter referred to as "PAD4") may have a radius smaller than PAD1, but larger than PAD2. However, PAD3 and PAD4 may be made equal initially. Additionally, the anti-pads may be made the same at layers L3 and L4. Thus, the pads PAD3 and PAD4 may be varied in a first tuning process increment along with the anti-pads associated with pads PAD3 and PAD4 relative to both the ground layer GL5 and GL6 and the anti-pad associated with the via annulus of the ground layers GL5 and GL6.

For example, the initial configuration of pads may include PAD1>PADs3/4>PAD2. If pads are provided on PCB layers L7-L15 of constant longitudinal structure 227 the pads may be referred to as "CPAD." In such instance, the initial configuration of pads may include PAD1>PAD3/4>PAD2>>CPAD. The pads CPAD of constant longitudinal structure 227 may be small to absent. However, the anti-pad of the constant longitudinal structure 227 at minimum is set to the minimum manufacture rule dictated anti-pad about the central via, but can also be varied in the optimizer process.

In the PCB layers L3-L19 described in FIGS. 2D, 3A-7 and 9-10, the PAD 4 was made larger than PAD1, after the tuning process.

Primary Loss Influences/Drivers

The primary loss influencers driving the tuning process may include the radio frequency (RF) trace entrance and exit transition geometry. The RF, digital and structural component transits of the design influence the cage via placement or prevention causing gapping in cage structure (energy leakage-loss factor). The cage via's outer cylinder tangency to anti-pad radius tangency may influence loss. The longer this distance the less governed the leakage energy is contained adding to transmission loss.

Easing of transition losses on the energy pathway may be accomplished in part by a dumbbell pattern framework. A dumbbell pattern may act as a matching network for energy transit of longitudinal distance. Implementation of pad/anti-pad without tuning consideration may cause significant reflection to transit energy resulting in blockage of RF signal.

The tuning process may move the cage via, which are terminated with a pad even when they are terminated to a ground layer, on any layer closer to subsequent pad/anti-pad combinations. Thus, the cage via causing the obstruction in subsequent layers are either moved further out, or the radius of the annulus of the ground layer is made smaller or a combination of both adjustments in pad and annulus radii until the loss is alleviated.

Electromagnetic Solver Type

Recommended solver type for this tuning method may include a frequency domain solver (finite element method) due to the resonant nature of the problem fine mesh control on structures. A secondary solver may include the Transient (Time Domain) or finite integration technique (FIT) and transmission line matrix (TLM) implementation. This method should be used for quick tuning, but not for the final design since it requires a high level of meshing to resolve the resonant characteristics of this process.

The electromagnetic solver, which tunes or impedance balances the long RF via, is a computer implemented process carried out on a computer having instructions stored in tangible, non-transitory computer readable medium and at least one processor. The instructions cause the processor to perform one or more of the acts described herein including forming a dumbbell pattern and vary the tuning sub-assemblies by varying the pad size per layer, anti-pad size per layer and the cage via location.

Structure Optimization Setup

PAD3 and PAD4 and their corresponding anti-pads of layers L3 and L4 may be made equal initially. Each anti-pad of layers L3 and L4 has two levels of anti-pad space that may be varied during optimization. If tuning is not achieved, these elements are individual and separate degrees of freedom.

Use manufacturing min and max rules as the bounds for optimizing boundaries for the PAD1, anti-pads of layer L3, PAD2, anti-pad of layer 4, PAD3, anti-pad of layer 5, PAD4, anti-pad of layer L6, CPAD, and anti-pad of layers L7-L15. Symmetry settings may be used about the central plane of the constant longitudinal structure 227 to limit tuning problems and/or reduce solver computation. When an optimized geometry is achieved a rerun may be performed in a finite element method code for the final design to be sent to the layout designer.

A layout designer may implement design and then send it back to an RF engineer for importation to EM simulations. Imported geometry is trimmed and adjusted to decouple the invention from the rest of the RF path. Using a finite element method code, the feature is simulated and compared against the design model. Differences should be challenged for differences in implementation between the design model and layout model. After iteration with two models' consensuses should be proven out. After the model is validated, the PCB engineer can review the design for compliance with the rules. Sometimes, practicality may dictate slight deviances from the design model. Thus, the designed model and actual design will be reconciled.

FIGS. 3A, 4-7, 9 and 10 illustrate schematic of layers of the PCB of a long RF via 120 or 220 according to the embodiments herein. The long RF via includes varying pad sizes along the radius, varying anti-pad sizes along the radii and varying virtual via boundaries and ground layer annuluses defining the anti-pads. The numerical values in FIGS. 3A, 4-7, 9 and 10 are for illustrative purposes only and may vary for each PCB assembly.

FIG. 3A illustrates a top view of a schematic portion of long RF via 120 or 220 about the $3^{rd}$ layer 300 of the PCB assembly. The $3^{rd}$ layer 300 includes a dielectric layer (not shown) stacked immediately above the ground layer GL3. The virtual cage via tangential boundary 340 is demarcated by the virtual boundary 343 which corresponds to the perimeter edge of the cage via tangential cylinders 332 within the long RF via 120 or 220. The anti-pad 350 at the ground layer GL3 is bound by the outer edge of the pad 345 and the inner annulus of the ground layer GL3 within the RF via.

Once the via holes are drilled through the PCBs, the side or inner walls may be coated with electrically conductive material. By way of non-limiting example, the coating may include copper plating along the inside surfaces of the holes forming the varying diameter annuluses. Thus, the etched metal "empty space" of the anti-pad between the ground plane and the pad perimeter provides electrical capacitance. Other metal may be used other than copper. By way of non-limiting example, palladium, gold, copper, and/or conductive slurry may be used.

The $3^{rd}$ layer 300 includes two-levels of anti-pad space, as best seen in FIG. 2D. The first level of anti-pad space corresponds to the empty space within the long RF via 120 or 220 from and along the dielectric layer (FIG. 2D) and the support column 255, except for the space occupied by cage vias.

The second level of anti-pads space is the ground layer from the pad to the ground layer annulus. The ground layer via annulus defines an end of the ground layer. The virtual via boundary is a virtual annulus or boundary at which via cages are placed tangentially therearound. The virtual via boundary may sometimes be referred to as virtual via annulus. The via cages 332 are shown cross hatched and are tangentially located to said boundary by a radius of approximately 19.5 mils from the center of the pad 345, spaced equidistant from one another center to center per the BC Process. The cage via 332 has a generally cylindrical shape. The cage via 332 connects the ground layer L2 to L3. The solid cage via 342 represents a cage via below the ground layer L3 and connects L3 to L4.

The pad radius PR of pad 345 of the $3^{rd}$ layer is approximately 11.2 mils which is measured from the center of the via support column 255 to the perimeter edge of pad 345. The anti-pad radius APR is measured to the outer limit of the anti-pad 350 relative to the center of the pad 345 of the $3^{rd}$ layer or the center of the via support column 255. The anti-pad radius APR is approximately 16.5 mil. The empty space of the anti-pad 350 may be a ring around the pad 345 defined by the gap or empty space between the outer perimeter edge of pad 345 and the inner perimeter edge of the ground layer GL3. The $3^{rd}$ layer's virtual cage via boundary 340 has a radius of approximately 19.5 mil from the center of the pad 345 or the center of the via support column 255.

The pad 345 connects to RF entrance trace 330 (i.e., trace 130) within tangential via placement border 335. The RF entrance trace 330 (i.e., trace 130) is bordered by coplanar waveguide channels 333. By way of non-limiting example, the distance from the virtual tangential via placement border 335 to one side of the trace 330 is approximately 4.5 mil. The virtual border 335 is for the placement of cage vias. The distance from the center of the cage via 332 tangential to the tangential via placement border 335 to the inner edge of the ground layer GL3 is approximately 14.5 mil. The coplanar waveguide channels 333 is filled with dielectric material. The cage via 342 is between the $3^{rd}$ layer and the $4^{th}$ layer.

FIG. 3B illustrates a partial side view of the long RF via about the $3^{rd}$ layer of the PCB. Additionally, FIG. 3B illustrates partial side view of the long RF via about the $2^{nd}$, $3^{rd}$ and $4^{th}$ ground layers to illustrate the cage vias 332 of the $3^{rd}$ layer and extends through the dielectric layer DL3 and cage vias 342 on the $4^{th}$ layer extends through the dielectric layer DL4. Trace 330 is located on the $3^{rd}$ layer.

Figure 4:
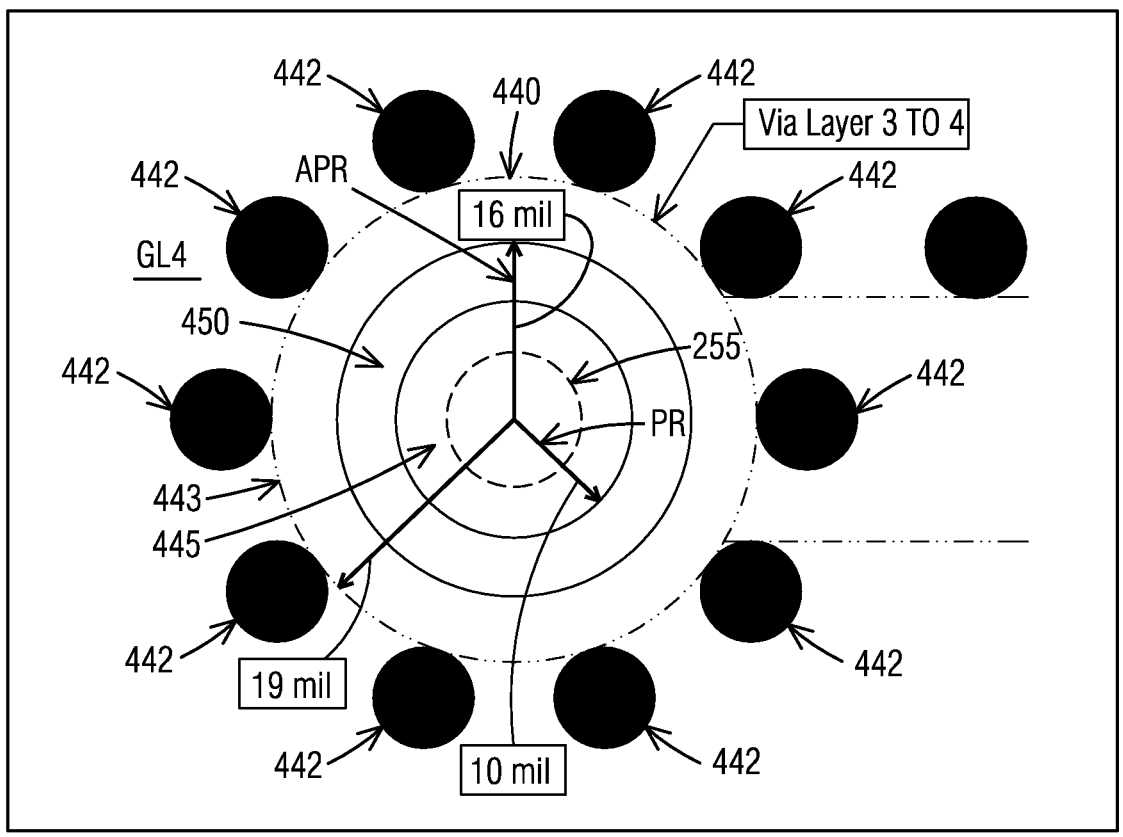
FIG. 4 illustrates a top view of the long RF via about the $4^{th}$ and $18^{th}$ layers of the PCB.

FIG. 4 illustrates a top view of the long RF via 120 about the $4^{th}$ layer 400 of the PCB. The $18^{th}$ layer is essentially identical to the $4^{th}$ layer 400 and therefore only the $4^{th}$ layer 400 will be described in detail. The $4^{th}$ layer 400 includes a dielectric layer DL4 stacked immediately above the ground layer GL4, as best seen in FIG. 2D. The virtual tangential cage via boundary 440 has a radius of approximately 19 mil from the center of the pad 445 about which the cage vias 442 are tangentially located to said boundary, spaced equidistant from one another, in some embodiments, center to center per the BC Process.

The $4^{th}$ layer 400 includes two-levels of anti-pad space. The first level of anti-pad space corresponds to the empty space within the long RF via 120 from and along the dielectric layer DL4 to the via support column 255, as best seen in FIG. 2D, except for the space occupied by cage vias.

The pad radius PR of pad 445 of the $4^{th}$ layer is approximately 10 mils which is measured from the center of the via support column 255 to the perimeter edge of pad 445. The anti-pad radius APR is measured to the outer limit of the anti-pad 450 relative to the center of the pad 445 of the $4^{th}$ layer or the center of the via support column 255. The anti-pad radius APR is approximately 16 mil. The empty space of the anti-pad 450 may be a ring around the pad 445 defined by the gap or empty space between the outer perimeter edge of pad 445 and the inner perimeter edge of the ground layer GL4. The ground layer GL4 has a second layer of anti-pad space 450.

Figure 5:
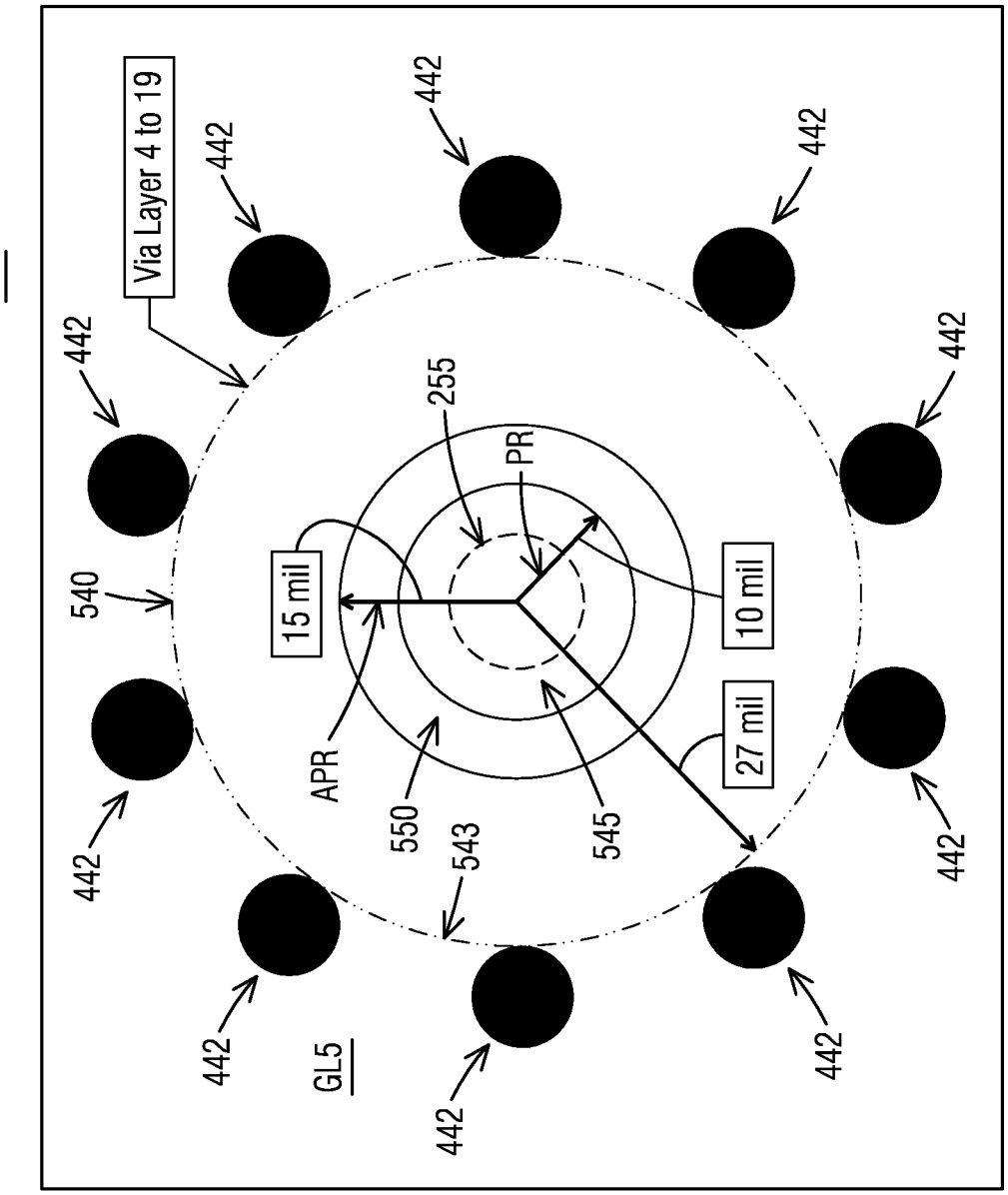
FIG. 5 illustrates a top view of the long RF via about the $5^{th}$ and $17^{th}$ layers of the PCB.

FIG. 5 illustrates a top view of the long RF via about the $5^{th}$ layer 500 of the PCB. The $17^{th}$ layer is essentially identical to the $5^{th}$ layer 500 and therefore only the $5^{th}$ layer 500 will be described in detail. The $5^{th}$ layer 500 includes a dielectric layer DL5 stacked immediately above the ground layer GL5, as seen in FIG. 2D. The virtual tangential cage via boundary 540 has a radius of approximately 27 mil from the center of the pad 545 about which the cage vias 442 are tangentially located spaced equidistant from one another, in some embodiments, center to center per the BC Process.

The $5^{th}$ layer 500 includes two-levels of anti-pad space. The first level of anti-pad space corresponds to the empty space within the long RF via 120 from and along the dielectric layer DL5 to the via support column 255, as best seen in FIG. 2D, except for the space occupied by cage vias. The second level corresponds to the anti-pad 450.

The pad radius PR of pad 545 of the $5^{th}$ layer is approximately 10 mils which is measured from the center of the via support column 255 to the perimeter edge of pad 545. The anti-pad radius APR is measured to the outer limit of the anti-pad 550 relative to the center of the pad 545 of the $5^{th}$ layer or the center of the via support column 255. The anti-pad radius APR is approximately 15 mil. The empty space of the anti-pad 550 may be a ring around the pad 545 defined by the gap or empty space between the outer perimeter edge of pad 545 and the inner perimeter edge of the ground layer GL5. The $5^{th}$ layer tangential cage via boundary 540 has a radius of approximately 27 mil from the center of the pad 545 or the center of the via support column 255.

Figure 6:
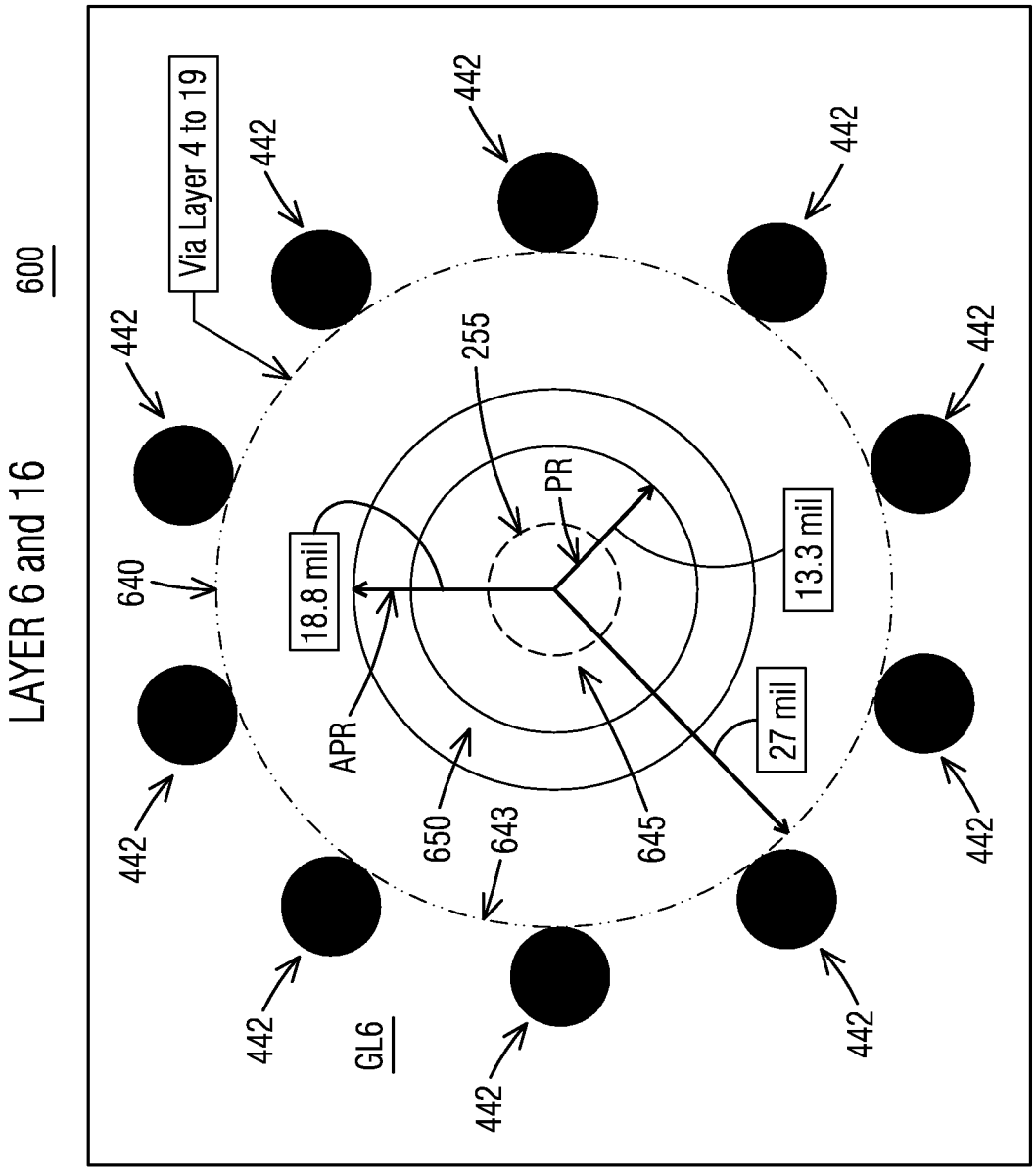
FIG. 6 illustrates a top view of the long RF via about the $6^{th}$ and $16^{th}$ layers of the PCB.

FIG. 6 illustrates a top view of the long RF via about the $6^{th}$ layer 600 of the PCB. The $16^{th}$ layer is essentially identical to the $6^{th}$ layer 600 and therefore only the $6^{th}$ layer 600 will be described in detail. The $6^{th}$ layer 600 includes a dielectric layer DL6 stacked immediately above the ground layer GL6, as best seen in FIG. 2D. The virtual tangential cage via boundary 640 has a radius of approximately 27 mil from the center of the pad 645 about which the cage vias 442 are tangentially located spaced equidistant from one another center to center per the BC process.

The $6^{th}$ layer 600 includes two-levels of anti-pad space. The first level of anti-pad space corresponds to the empty space within the long RF via 120 from and along the dielectric layer DL6 to the via support column 255, as best seen in FIG. 2D, except for the space occupied by cage vias.

The pad radius PR of pad 645 of the $6^{th}$ layer is approximately 13.3 mils which is measured from the center of the via support column 255 to the perimeter edge of pad 645. The anti-pad radius APR is measured to the outer limit of the anti-pad 650 relative to the center of the pad 645 of the $6^{th}$ layer or the center of the via support column 255. The anti-pad radius APR is approximately 18.8 mil. The empty space of the anti-pad 650 may be a ring around the pad 645 defined by the gap or empty space between the outer perimeter edge of pad 645 and the inner perimeter edge of the ground layer GL6. The $6^{th}$ layer tangential cage via boundary 640 has a radius of approximately 27 mil from the center of the pad 645 or the center of the via support column 255.

Figure 7:
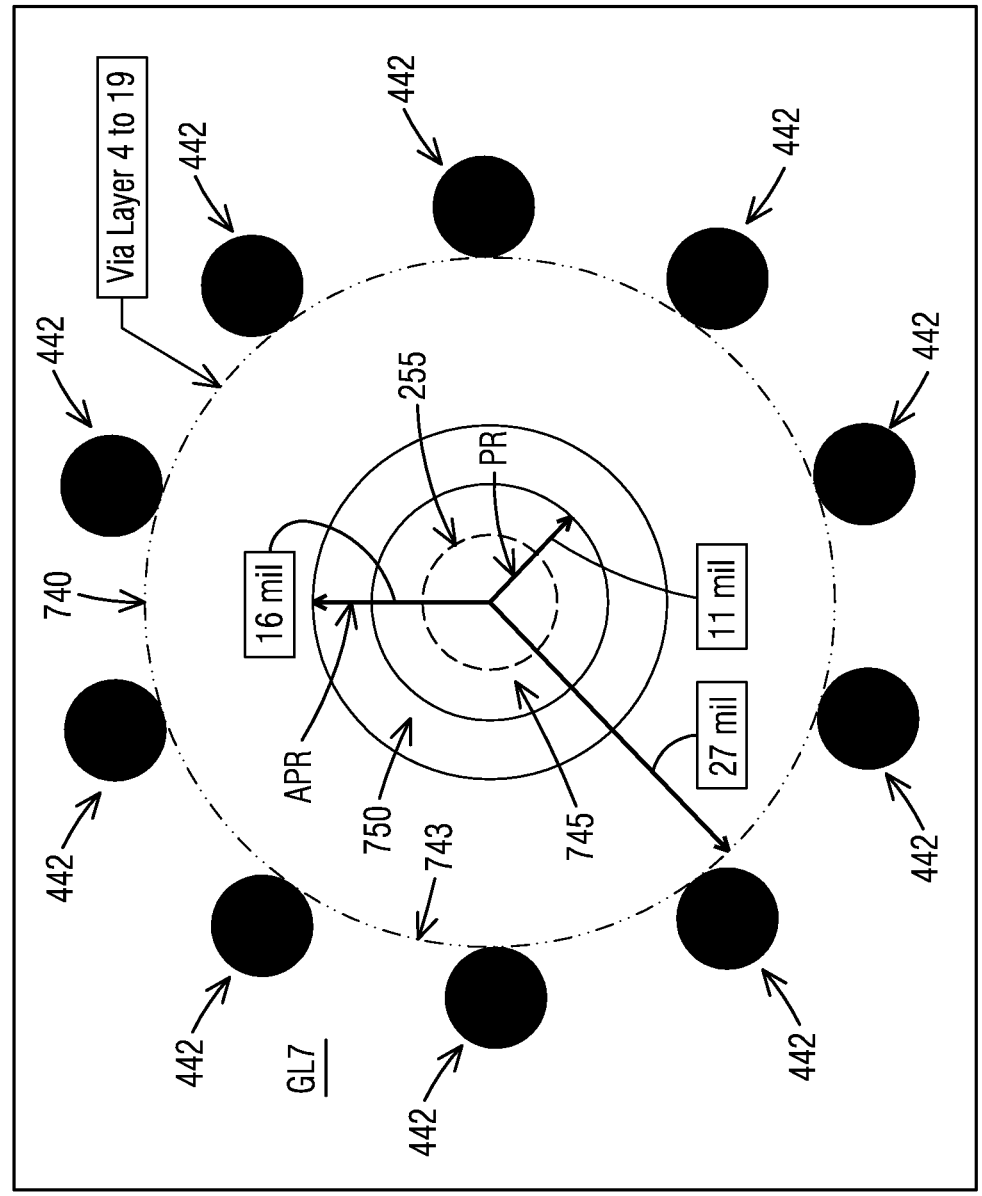
FIG. 7 illustrates a top view of the long RF via about the $7^{th}$ through $15^{th}$ layers of the PCB.

FIG. 7 illustrates a top view of the long RF via about the $7^{th}$ layer 700 of the PCB. The $7^{th}$ through $15^{th}$ layers are essentially identical and therefore only the $7^{th}$ layer 700 will be described in detail. The $7^{th}$ layer 700 includes a dielectric layer DL7 stacked immediately above the ground layer GL7, as best seen in FIG. 2D. The virtual tangential cage via boundary 740 has a radius of approximately 27 mil from the center of the pad 745 about which the cage vias 442 are tangentially located spaced equidistant from one another, in some embodiments, center to center per the BC process. The $7^{th}$ layer 700 includes two-levels of anti-pad space. The first level of anti-pad space corresponds to the empty space within the long RF via 120 of the dielectric layer DL7 to the via support column 255, as best seen in FIG. 2D, except for the space occupied by cage vias.

The pad radius PR of pad 745 of the 7th layer is approximately 11 mils which is measured from the center of the via support column 255 to the perimeter edge of pad 745. The anti-pad radius APR is measured to the outer limit of the anti-pad 750 relative to the center of the pad 745 of the 7th layer or the center of the via support column 255. The anti-pad radius APR is approximately 16 mil. The empty space of the anti-pad 750 may be a ring around the pad 745 defined by the gap or empty space between the outer perimeter edge of pad 745 and the inner perimeter edge of the ground layer GL7. The 7th layer tangential cage via boundary 740 has a radius of approximately 27 mil from the center of the pad 745 or the center of the via support column 255.

Figure 8:
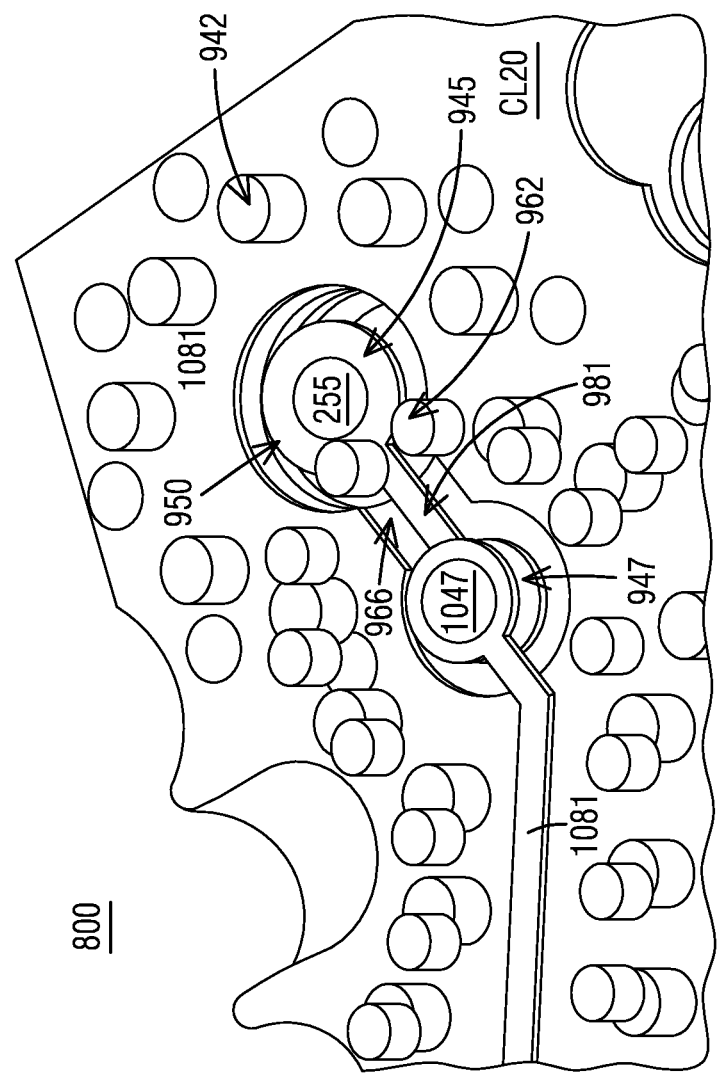
FIG. 8 illustrates a top perspective view of the $19^{th}$ and $20^{th}$ layers of the PCB, the long RF via and cage vias.

FIG. 8 illustrates a top perspective view of the 19th and 20th layers of the PCB, the long RF via and cage vias. Therefore, FIGS. 8-10 will be described together.

Figure 10:
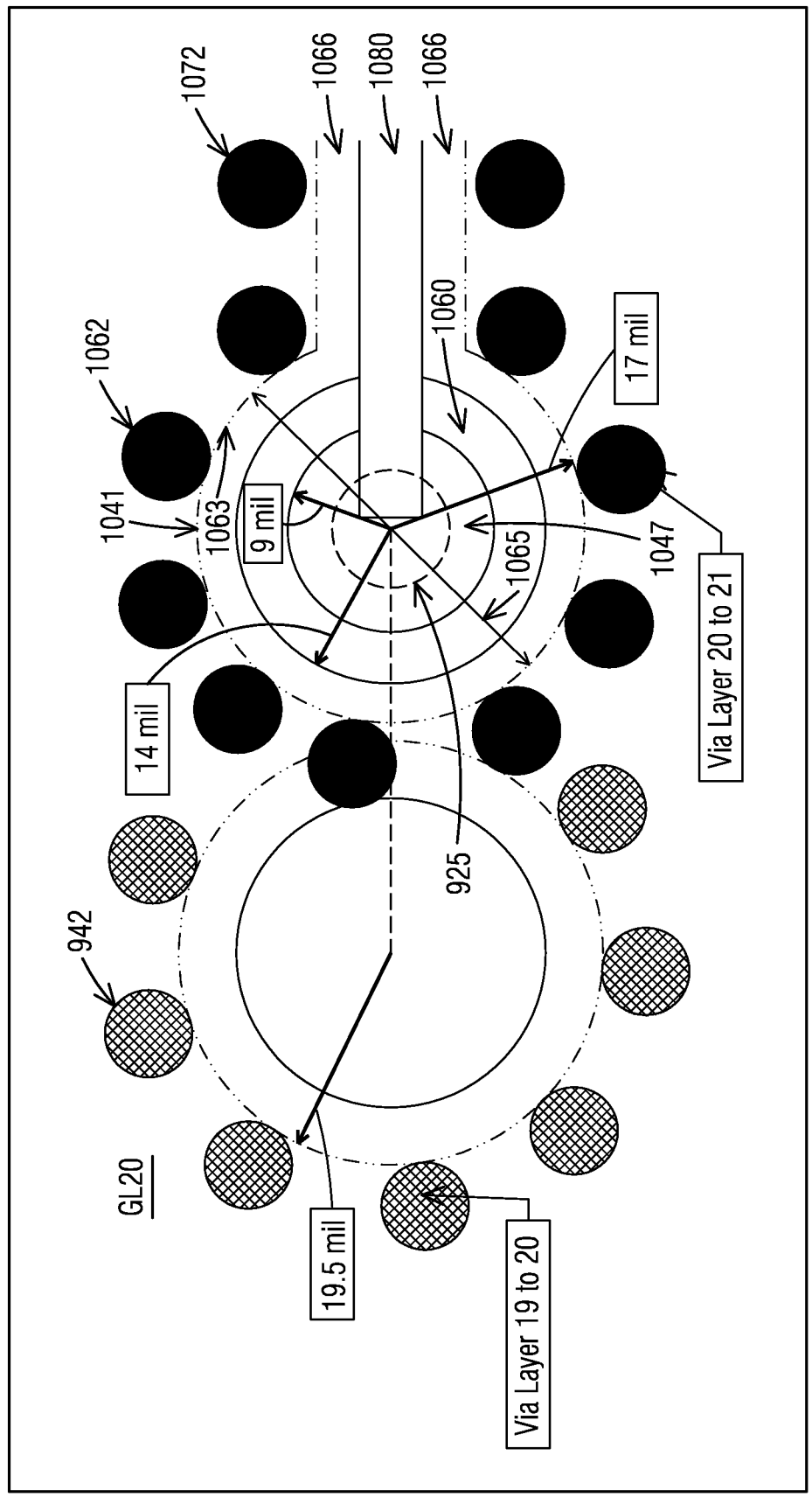
FIG. 10 illustrates a top view of the $20^{th}$ layer of the PCB and the long RF via with cage vias.

FIG. 9 illustrates a top view of the 19th layer 900 of the PCB and the long RF via with cage vias 942 which connect GL19 to GL20, as seen in FIG. 10. The 19th layer 900 is essentially identical to the 3rd layer 300. However, the 19th layer interconnects to a secondary via 925 along RF transition trace 981 extending between the pad 945 of the long RF via 120 and pad 947 of the secondary via 925. The secondary via 925 transitions the RF signal from the 19th layer, the last layer of the via 120, to the 20th layer of the PCB.

The 19th layer 900 includes a dielectric layer DL19 stacked immediately above the ground layer GL19, as seen in FIG. 2D. The virtual tangential cage via boundary 940 has a radius of approximately 27 mil from the center of the pad 945 about which the cage vias 442 are tangentially located spaced equidistant from one another center to center per the BC process. The 19th layer 900 includes two-levels of anti-pad space. The first level of anti-pad space corresponds to the empty space within the long RF via 120 from and along the dielectric layer DL19 to the via support column 255, as best seen in FIG. 2D, except for the space occupied by the cage vias.

The pad radius PR of pad 945 of the 19th layer is approximately 11.2 mils which is measured from the center of the via support column 255 to the perimeter edge of pad 945. The anti-pad radius APR is measured to the outer limit of the anti-pad 950 relative to the center of the pad 945 of the 19th layer or the center of the via support column 255. The anti-pad radius APR is approximately 16.5 mil. The empty space of the anti-pad 950 may be a ring around the pad 945 defined by the gap or empty space between the outer perimeter edge of pad 945 and the inner perimeter edge of the ground layer GL19. The 19th layer tangential cage via boundary 940 has a radius of approximately 27 mil from the center of the pad 945 or the center of the via support column 255.

By way of non-limiting example, the larger annulus of 27 mil is larger than the annulus of the 3rd layer 300 to accommodate for the partial overlap between the long RF via 120 and the secondary via 925. The secondary via 925 includes a pad 947. The center of pad 947 and the center of pad 945 are aligned. The pad 947 has a radius of approximately 9 mil. The virtual tangential cage via boundary 941 of the secondary via 925 has a radius of 17 mil. The anti-pad 960 has a radius from the center of pad 947 of approximately 14 mil. By way of example, the distance between the center pads 945 and 947 is approximately 38 mil.

The ring of the anti-pad 960 ring and the ring of the anti-pad 950 are interconnected by parallel anti-pad channels 966 on opposite sides of the RF transition trace 981. The virtual tangential cage via boundary 941 of the secondary via 925 extends from layer L18 down to layer L19. Alternately, the secondary via 925 extends from the 19th layer down to the 20th layer.

FIG. 10 illustrates a top view of the 20th layer 1000 of the PCB and the secondary via 925 with cage vias 1062. The pad 1047 has the same radius of pad 947 of the 19th layer of approximately 9 mil. The anti-pad radius relative to the center of the pad 1047 is approximately 14 mil. The virtual tangential cage via boundary 1041 is the same size as the annulus 941 of approximately 17 mil.

The cage via 942 are from the 19th layer and represented in cross hatch circles. The tangential cage via boundary 1041 has a radius of approximately 17 mil from the center of the pad 1047 about which the cage via 1062 are tangentially located spaced equidistant from one another center to center per the BC process. The cage vias 1072 are placed along the path of the RF exit trace 1080 bordered by anti-pad channels 1066.

FIG. 11A illustrates a PCB assembly 1100A with a long RF via 1120 with the top principal tuning section 1129A blocked off along with some of the layers of the constant longitudinal structure 1127. The lower or bottom principal tuning section 1229B is also marked. The top principal tuning section 1229A and bottom principal tuning section 1229B are separated by the constant longitudinal structure 1127. The top principal tuning section 1229A, bottom principal tuning section 1229B and the constant longitudinal structure 1127 form the primary longitudinal structure. The RF entrance trace 1130 feeds the RF signal to the top principal tuning section 1229A.

Figure 11B:
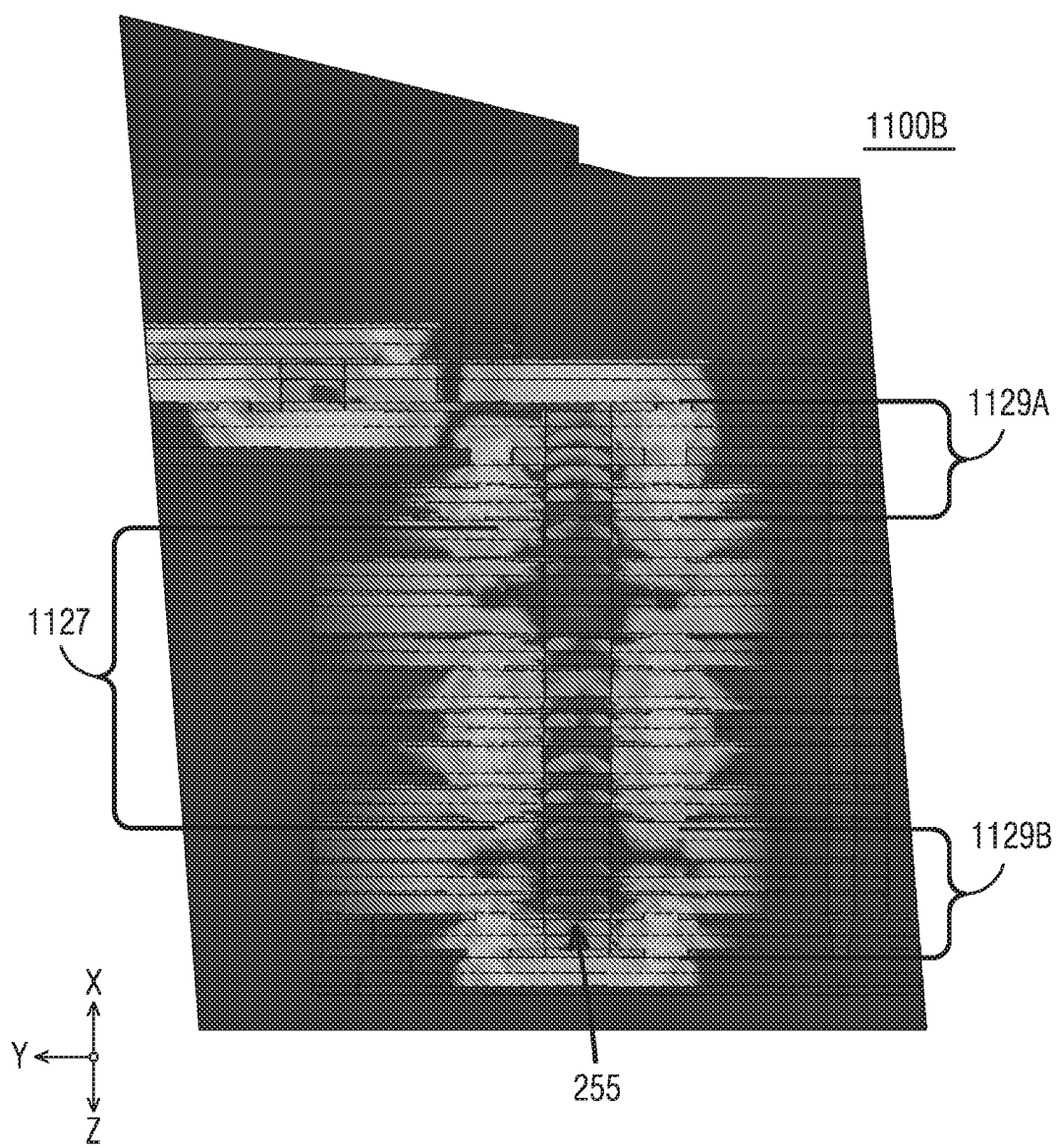
FIG. 11B illustrates a balanced impedance signature along the length of the long RF via of FIG. 11A.

Referring also to FIG. 11B, a balanced impedance signature 1100B along the length of the long RF via 1120 of FIG. 11A is shown. As shown in FIGS. 11A and 11B, from the mid-point along the support column 255 the electric field is generally symmetrically shaped, representative of balanced impedance along the multiple stacks of the PCB assembly. The electric field is an animation of the simulation.

Figure 11C:
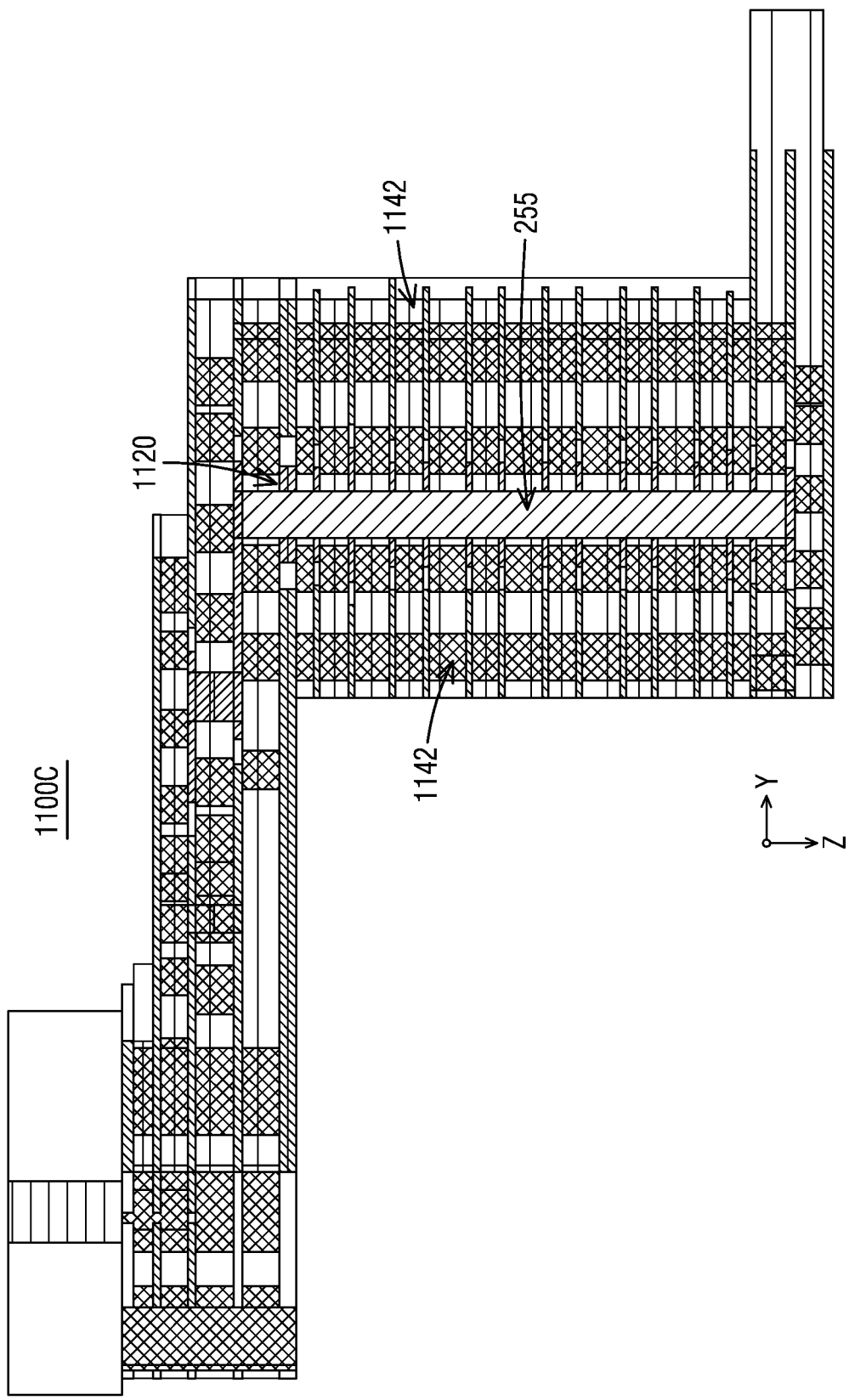
FIG. 11C illustrates the long RF via with the top principal tuning section blocked along with some of the layers of the constant longitudinal structure.

FIG. 11C illustrates a PCB assembly 1100C with the long RF via 1120 and showing the cage vias 1142 and support column 255.

FIG. 11D illustrates an image of a balanced impedance signature 1100D along the length of the long RF via of FIG. 11C.

Figure 12A:
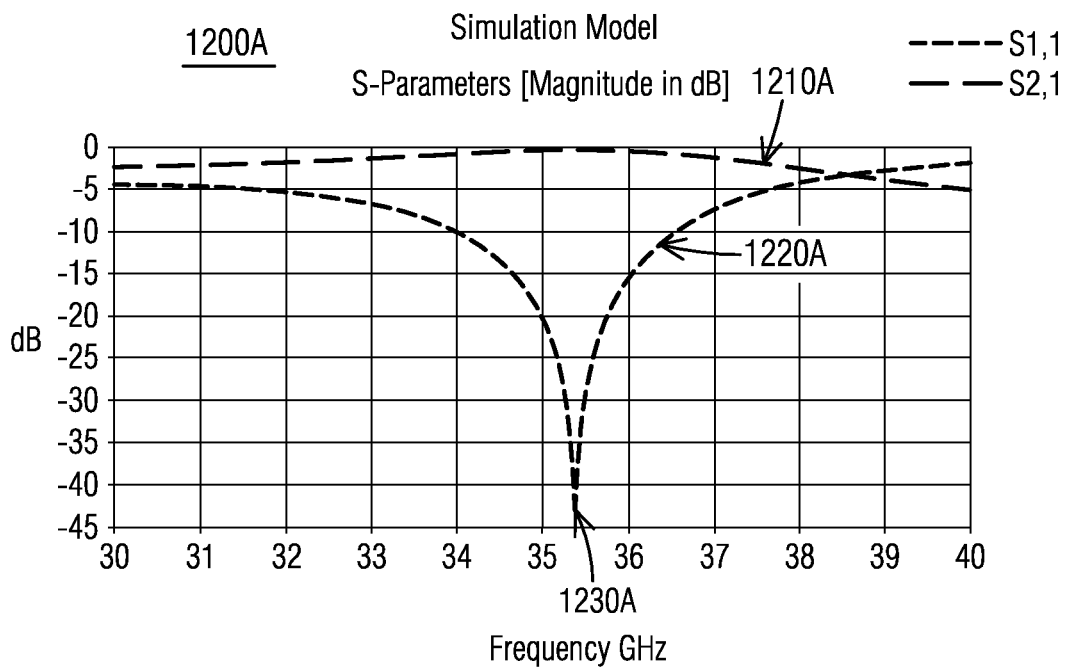
FIG. 12A illustrates a graphical representation of an impedance matching according to the principals described herein using a simulated model.

FIG. 12A illustrates a graphical representation 1200A of impedance matching according to the principals described herein using a simulated model. The simulated results of the graphical representation 1200A show fine tuning in the desired band, denoted by peak 1230A. The peak 1230A is formed in the range of 35-36 GHz. Line 1220A corresponds to the insertion loss and should be designed to be as low as possible, such as from a very negative number over −10 dB. The line 1210A corresponds to the transmission loss and should be as low as possible. The ideal transmission loss is about 0 dB.

Figure 12B:
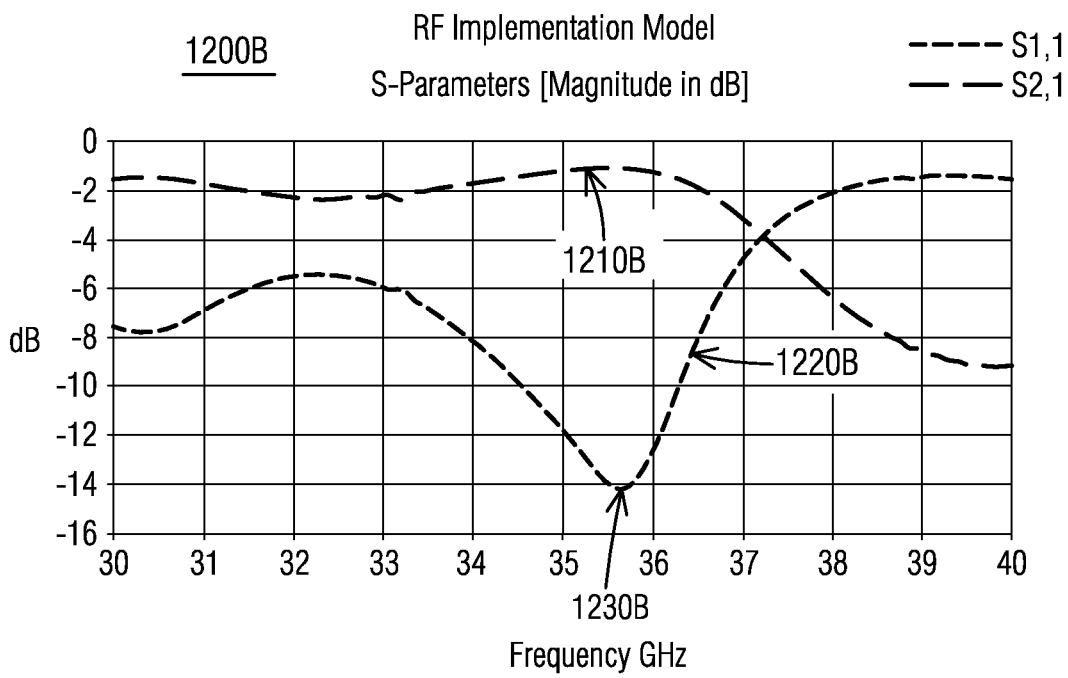
FIG. 12B illustrates a graphical representation of the impedance matching according the principals described herein using a radio frequency (RF) model implementation.

FIG. 12B illustrates a graphical representation 1200B of the impedance matching according the principals described herein using a radio frequency (RF) model implementation. The results of the graphical representation 1200B shows tuning in the desired band, denoted by peak 1230B. The peak 1230B is in the range of 35-36 GHz. The differences in the graphical representation 1200A relative to graphical representation 1200B are due to a longer path length and model loading. Line 1220B corresponds to the insertion loss of the implemented device. The line 1210B corresponds to the transmission of the implemented device. The differences in FIGS. 12A and 12B can be attributed to the implemented model includes a completed circuit.

FIG. 13 illustrates a flowchart of a method for tuning a long RF via. The method 1300 comprises, at block 1305, modelling a radio frequency (RF) via having a via hole formed in a plurality of printed circuit board (PCB) layers. The via hole having a center conductive support column, a primary longitudinal structure comprising a constant longitudinal structure, and a first principal tuning sub-assembly formed in a first portion of the RF via located above the constant longitudinal structure and at a first or entrance end of the primary longitudinal structure and comprising a first set of pad, anti-pad pairs to receive and pass an RF band. The via hole having a second principal tuning sub-assembly formed in a second portion of the RF via below the constant longitudinal structure and at a second or exit end of the primary longitudinal structure and comprising a second set of pad, anti-pad pairs tuned to receive and pass the RF band and mirroring the first set of pad, anti-pad pairs.

The method 1300 comprises, at block 1310, tuning the RF via by independently changing radii of one or more pad, anti-pad pairs of the first set of pad, anti-pad pairs. The method 1300 may comprise, at block 1315, tuning the RF via by mirroring the changes to the radii in the first set of pad, anti-pad pairs in the second set of pad, anti-pad pairs. The method 1300 may comprise, at block 1320, determining whether the tuned first set of pad, anti-pad pairs and the tuned second set of pad, anti-pad pairs are symmetrically tuned to the RF band. The method 1300 may comprise, at block 1325, repeating the tuning of the RF via using the first set of pad, anti-pad pairs and the second set of pad, anti-pad pairs until a level of tuning is achieved.

Each PCB layer of the plurality of PCB layers may comprise a dielectric layer and a ground layer having a first virtual via boundary and a second via annulus. The first via boundary and the second via annulus have different radii relative to a center of the RF via and are variable. Each pad, anti-pad pair may be independently adjustable relative to the first via boundary and the second via annulus. Alternately, pairs in each tuning section may be adjusted together or simultaneously wherein a change in a pair in the first set of pad, anti-pad pairs causes an equal change in the mirrored pair of the second set of pad, anti-pad pairs.

The RF via further comprises a plurality of cage vias within each dielectric layer surrounding and tangential to the first virtual via boundary of the ground layer. The method may comprise varying a first amount of distance of the plurality of cage vias on a respective one PCB layer equidistant from a pad of the pad/anti-pad pair of the same PCB layer of the first principal tuning sub-assembly to tune the model to the RF band and those cage vias on remaining PCB layers of the first principal tuning sub-assembly.

The method may comprise varying a second amount of distance of the plurality of cage vias on a respective one PCB layer equidistant from a pad of the pad/anti-pad pair of the same PCB layer of the second principal tuning sub-assembly to tune the model to the RF band and those cage vias on remaining PCB layers of the second principal tuning sub-assembly wherein the first amount of distance and the second amount of distance is the same amount. The method may comprise repeating the varying of the distance of those cage vias to adjust the level of tuning to the RF band. The varying of the first amount of distance of the plurality of cage vias may further comprise varying the first virtual via boundary relative to a pad associated with the ground layer of the same PCB layer.

The modelling of the RF via having the via hole with the center conductive support column may further comprise forming a dumbbell pattern along the center conductive support column with the first principal tuning sub-assembly and the second principal tuning sub-assembly at opposite ends of the center conductive support column and mirrored relative to each other.

Each PCB layer of the plurality of PCB layers comprises a dielectric layer and a ground layer having a first virtual via boundary and a second via annulus. The first via boundary and the second via annulus have different radii relative to a center of the RF via. The constant longitudinal structure comprises a third portion of the RF via comprising a subset of PCB layers of the plurality of PCB layers. The modelling the RF via may further comprise varying the radius of the first via boundary of each PCB layer of the constant longitudinal structure to have a first radii; and varying the radius of the second via annulus of the ground layer of each PCB layer of the constant longitudinal structure to have a second radii different from the first radii.

The tuning of the first set of pad, anti-pad pairs and tuning the second set of pad, anti-pad pairs may include creating matched impendence balancing along a pathway of the RF via.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising." Moreover, unless specifically stated, any use of the terms first, second, etc., does not denote any order or importance, but rather the terms first, second, etc., are used to distinguish one element from another.

Unless otherwise defined, all terms (including technical and scientific terms) used herein have the same meaning as commonly understood by one of ordinary skill in the art to which embodiments of the invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While various disclosed embodiments have been described above, it should be understood that they have been presented by way of example only, and not limitation. Numerous changes, omissions and/or additions to the subject matter disclosed herein can be made in accordance with the embodiments disclosed herein without departing from the spirit or scope of the embodiments. Also, equivalents may be substituted for elements thereof without departing from the spirit and scope of the embodiments. In addition, while a particular feature may have been disclosed with respect to only one of several implementations, such feature may be combined with one or more other features of the other implementations as may be desired and advantageous for any given or particular application. Furthermore, many modifications may be made to adapt a particular situation or material to the teachings of the embodiments without departing from the scope thereof.

Further, the purpose of the foregoing Abstract is to enable the U.S. Patent and Trademark Office and the public generally and especially the scientists, engineers and practitioners in the relevant art(s) who are not familiar with patent or legal terms or phraseology, to determine quickly from a cursory inspection the nature and essence of this technical disclosure. The Abstract is not intended to be limiting as to the scope of the present disclosure in any way.

Therefore, the breadth and scope of the subject matter provided herein should not be limited by any of the above explicitly described embodiments. Rather, the scope of the embodiments should be defined in accordance with the following claims and their equivalents.

The invention claimed is:

1. A printed circuit board (PCB) apparatus, comprising:
a plurality of printed circuit board (PCB) layers (L3-L19) forming a stack of PCB layers having formed therein a primary longitudinal structure (221) forming a radio frequency (RF) via (220) including a principal tuning section (223) and a constant longitudinal structure (227) along a conductive column support (255) journaled through the PCB layers (L3-L19) in the via (220), the principal tuning section (223) comprising:
a first principal tuning sub-assembly (229A) formed in a first portion of the RF via (220) located above the constant longitudinal structure (227) and at a first or entrance end of the primary longitudinal structure (221) and comprising a first set of pad, anti-pad pairs (445, 545, 645) tuned to receive and pass an RF band and pads of the first set of pad, anti-pad pairs have varying radii; and
a second principal tuning sub-assembly (229B) formed in a second portion of the RF via (220) below the constant longitudinal structure (227) and at a second or exit end of the primary longitudinal structure (221) and comprising a second set of pad, anti-pad pairs (445, 545, 645) tuned to receive and pass the RF band and mirroring the first set of pad, anti-pad pairs (445, 545, 645).

2. The apparatus according to claim 1, wherein the first principal tuning sub-assembly (229A) includes independently configurable via virtual boundary dimensions along each PCB layer of the first portion of the RF via (220) at which to place at least one cage via (442); and the second principal tuning sub-assembly (229B) includes independently configurable virtual boundary dimensions along each PCB layer within the second portion of the RF via (220).

3. The apparatus according to claim 2, wherein the first principal tuning sub-assembly (229A) includes independently configurable pad, anti-pad pair dimensions along said each PCB layer of the first portion of the RF via (220); and the second principal tuning sub-assembly (229B) includes independently configurable pad/anti-pad pair dimensions along said each PCB layer within the second portion of the RF via (220).

4. The apparatus according to claim 3, wherein the constant longitudinal structure (227) comprises a third portion of the RF via (220) wherein the pad, anti-pad dimensions for each PCB layer (L7-L15) in the third portion are equal.

5. The apparatus according to claim 3, wherein:
each PCB layer (L3-L19) comprises a dielectric layer (DL3-DL19) and a ground layer (GL3-GL19), the ground layer having a first virtual via boundary and a second via annulus;
the first via boundary and the second via annulus have different radii relative to a center of the RF via;
the RF via (220) further comprising a plurality of cage vias (442) tangentially arranged relative to and around the first virtual via boundary and within the dielectric layer; and
each cage via (442) on a respective one PCB layer is equidistant from a pad of the pad/anti-pad pair of the same PCB layer.

6. The apparatus according to claim 5, wherein the pad having a thickness corresponding to a thickness of the ground layer.

7. A tangible and non-transitory computer readable medium having program instructions which when executed by one or more processors causes the one or more processors to:
model a radio frequency (RF) via having a via hole formed in a plurality of printed circuit board (PCB) layers (L3-L19), the via hole having a center conductive support column, a primary longitudinal structure (221) comprising a constant longitudinal structure (227), a first principal tuning sub-assembly (229A) formed in a first portion of the RF via (220) located above the constant longitudinal structure (227) and at a first or entrance end of the primary longitudinal structure (221) and comprising a first set of pad, anti-pad pairs (445, 545, 645) to receive and pass an RF band, and a second principal tuning sub-assembly (229B) formed in a second portion of the RF via (220) below the constant longitudinal structure (227) and at a second or exit end of the primary longitudinal structure (221) and comprising a second set of pad, anti-pad pairs (445, 545, 645) tuned to receive and pass the RF band and mirroring the first set of pad, anti-pad pairs (445, 545, 645);
tune the model by independently changing radii of one or more pad, anti-pad pairs of the first set of pad, anti-pad pairs (445, 545, 645);
tune the model by mirroring the changes to the radii in the first set of pad, anti-pad pairs in the second set of pad, anti-pad pairs (445, 545, 645);
determine whether the tuned first set of pad, anti-pad pairs (445, 545, 645) and the tuned second set of pad, anti-pad pairs (445, 545, 645) are symmetrically tuned to the RF band; and
repeat the tuning of the model using the first set of pad, anti-pad pairs (445, 545, 645) and the second set of pad, anti-pad pairs (445, 545, 645) until a level of tuning is achieved.

8. The computer readable medium according to claim 7, wherein each PCB layer of the plurality of PCB layers (L3-L19) comprises a dielectric layer (DL3-DL19) and a ground layer (GL3-GL19), the ground layer having a first virtual via boundary and a second via annulus; the first virtual via boundary and the second via annulus have different radii relative to a center of the RF via (220); and each pad, anti-pad pair is independently adjustable relative to the first via boundary and the second via annulus.

9. The computer readable medium according to claim 7, wherein each PCB layer of the plurality of PCB layers (L3-L19) comprises a dielectric layer (DL3-DL19) and a ground layer (GL3-GL19), the ground layer having a first virtual via boundary and a second via annulus; the first via boundary and the second via annulus have different radii relative to a center of the RF via (220); the RF via (220) further comprising a plurality of cage vias (442) tangentially arranged relative to and around the first via boundary of each PCB layer within the dielectric layer; and wherein the model further comprises a plurality of cage vias (442) on each dielectric layer surrounding the first via boundary, and wherein the program instructions further to cause the one or more processors to:

vary a first amount of distance of the plurality of cage vias (442) on a respective one PCB layer equidistant from a pad of the pad/anti-pad pair of the same PCB layer of the first principal tuning sub-assembly (229A) to tune the model to the RF band and those cage vias (442) on remaining PCB layers of the first principal tuning sub-assembly;

vary a second amount of distance of the plurality of cage vias (442) on a respective one PCB layer equidistant from a pad of the pad/anti-pad pair of the same PCB layer of the second principal tuning sub-assembly (229B) to tune the model to the RF band and those cage vias (442) on remaining PCB layers of the second principal tuning sub-assembly wherein the first amount of distance and the second amount of distance is the same amount; and repeat the varying of the distance of those cage vias (442) to adjust the level of tuning to the RF band.

10. The computer readable medium according to claim 9, wherein the instructions executed by the one or more processors to vary of the first amount of distance of the plurality of cage vias (442) further comprising instructions to vary the first via boundary relative to a pad associated with the ground layer of the same PCB layer.

11. The computer readable medium according to claim 10, wherein the instructions executed by the one or more processors to model the RF via (220) having the via hole with the center conductive support column further comprising instructions to form a dumbbell pattern along the center conductive support column with the first principal tuning sub-assembly (229A) and the second principal tuning sub-assembly (229B) at opposite ends of the center conductive support column and mirrored relative to each other.

12. The computer readable medium according to claim 7, wherein each PCB layer of the plurality of PCB layers (L3-L19) comprises a dielectric layer (DL3-DL19) and a ground layer (GL3-GL19), the ground layer having a first virtual via boundary and a second via annulus; the first via boundary and the second via annulus have different radii relative to a center of the RF via (220); the constant longitudinal structure (227) comprises a third portion of the RF via (220) comprises a subset of PCB layers (L7-L15) of the plurality of PCB layers (L3-L19) wherein the instructions executed by the one or more processor to model the RF via (220) further comprising instructions to:

vary the radius of the first virtual via boundary of each PCB layer of the constant longitudinal structure (227) to have a first radii; and vary the radius of the second via annulus of each PCB layer of the constant longitudinal structure (227) to have a second radii different from the first radii.

13. The computer readable medium according to claim 7, wherein the instructions which when executed to tune the first set of pad, anti-pad pairs (445, 545, 645) and tune the second set of pad, anti-pad pairs (445, 545, 645) include instructions to create matched impendence balancing along a pathway of the RF via (220).

14. A method comprising:

modelling a radio frequency (RF) via having a via hole formed in a plurality of printed circuit board (PCB) layers (L3-L19), the via hole having a center conductive support column, a primary longitudinal structure (221) comprising a constant longitudinal structure (227), a first principal tuning sub-assembly (229A) formed in a first portion of the RF via (220) located above the constant longitudinal structure (227) and at a first or entrance end of the primary longitudinal structure (221) and comprising a first set of pad, anti-pad pairs (445, 545, 645) to receive and pass an RF band, and a second principal tuning sub-assembly (229B) formed in a second portion of the RF via (220) below the constant longitudinal structure (227) and at a second or exit end of the primary longitudinal structure (221) and comprising a second set of pad, anti-pad pairs (445, 545, 645) tuned to receive and pass the RF band and mirroring the first set of pad, anti-pad pairs;

tuning the RF via (220) by independently changing radii of one or more pad, anti-pad pairs of the first set of pad, anti-pad pairs (445, 545, 645);

tuning the RF via (220) by mirroring the changes to the radii in the first set of pad, anti-pad pairs in the second set of pad, anti-pad pairs (445, 545, 645);

determining whether the tuned first set of pad, anti-pad pairs (445, 545, 645) and the tuned second set of pad, anti-pad pairs (445, 545, 645) are symmetrically tuned to the RF band; and repeating the tuning of the RF via (220) using the first set of pad, anti-pad pairs (445, 545, 645) and the second set of pad, anti-pad pairs (445, 545, 645) until a level of tuning is achieved.

15. The method according to claim 14, wherein each PCB layer of the plurality of PCB layers (L3-L19) comprises a dielectric layer (DL3-DL19) and a ground layer (GL3-GL19), the ground layer having a first virtual via boundary and a second via annulus; the first via boundary and the second via annulus have different radii relative to a center of the RF via (220); and each pad, anti-pad pair is independently adjustable relative to the second via annulus.

16. The method according to claim 14, wherein each PCB layer of the plurality of PCB layers (L3-L19) comprises a dielectric layer (DL3-DL19) and a ground layer (GL3-GL19), the ground layer having a first virtual via boundary and a second via annulus; the first via boundary and the second via annulus have different radii relative to a center of the RF via (220); and the RF via (220) further comprising a plurality of cage vias (442) tangentially arranged relative to and around the first via boundary of each PCB layer; and wherein the RF via (220) further comprises a plurality of cage vias (442) on each dielectric layer surrounding the first via boundary, and wherein the method comprises:

varying a first amount of distance of the plurality of cage vias (442) on a respective one PCB layer equidistant from a pad of the pad/anti-pad pair of the same PCB layer of the first principal tuning sub-assembly to tune the RF via (220) to the RF band and those cage vias (442) on remaining PCB layers of the first principal tuning sub-assembly (229A);

varying a second amount of distance of the plurality of cage vias (442) on a respective one PCB layer equidistant from a pad of the pad/anti-pad pair of the same PCB layer of the second principal tuning sub-assembly to tune the RF via (220) to the RF band and those cage vias (442) on remaining PCB layers of the second principal tuning sub-assembly (229B) wherein the first amount of distance and the second amount of distance is the same amount; and repeating the varying of the distance of those cage vias (442) to adjust the level of tuning to the RF band.

17. The method according to claim 16, wherein the varying of the first amount of distance of the plurality of cage vias (442) further comprising varying the first via boundary relative to a pad associated with the ground layer of the same PCB layer.

18. The method according to claim 17, wherein the modelling of the RF via (220) having the via hole with the center conductive support column further comprising forming a dumbbell pattern along the center conductive support column with the first principal tuning sub-assembly (229A) and the second principal tuning sub-assembly (229B) at opposite ends of the center conductive support column and mirrored relative to each other.

19. The method according to claim 14, wherein each PCB layer of the plurality of PCB layers (L3-L19) comprises a dielectric layer (DL3-DL19) and a ground layer (DL3-DL19), the ground layer having a first virtual via boundary and a second via annulus; the first via boundary and the second via annulus have different radii relative to a center of the RF via (220); the constant longitudinal structure (227) comprises a third portion of the RF via (220) comprises a subset of PCB layers (L7-L15) of the plurality of PCB layers (L3-L19) wherein the modelling the RF via (220) further comprising:

varying the radius of the first via boundary of each PCB layer of the constant longitudinal structure (227) to have a first radii; and varying the radius of the second via annulus of the ground layer of each PCB layer of the constant longitudinal structure (227) to have a second radii different from the first radii.

20. The method according to claim 14, wherein the tuning the first set of pad, anti-pad pairs (445, 545, 645) and tuning the second set of pad, anti-pad pairs (445, 545, 645) include creating matched impendence balancing along a pathway of the RF via (220).

* * * * *